US007629087B2

United States Patent
Huh et al.

(10) Patent No.: US 7,629,087 B2
(45) Date of Patent: Dec. 8, 2009

(54) PHOTOMASK, METHOD OF MAKING A PHOTOMASK AND PHOTOLITHOGRAPHY METHOD AND SYSTEM USING THE SAME

(75) Inventors: Sungmin Huh, Yongin-Si (KR); Heebom Kim, Suwon-Si (KR); Donggun Lee, Hwaseong-Si (KR); Chanuk Jeon, Seongnam-Si (KR)

(73) Assignee: Samsung Electronics Co., Ltd. (KR)

( * ) Notice: Subject to any disclaimer, the term of this patent is extended or adjusted under 35 U.S.C. 154(b) by 360 days.

(21) Appl. No.: 11/438,965

(22) Filed: May 23, 2006

(65) Prior Publication Data
US 2006/0286460 A1 Dec. 21, 2006

(30) Foreign Application Priority Data
Jun. 15, 2005 (KR) .................. 10-2005-0051264

(51) Int. Cl.
G03F 1/00 (2006.01)
(52) U.S. Cl. .................. 430/5; 430/311; 359/562
(58) Field of Classification Search .................. 430/5, 430/311; 359/562
See application file for complete search history.

(56) References Cited

U.S. PATENT DOCUMENTS

| | | | |
|---|---|---|---|
| 5,245,470 A | 9/1993 | Keum | |
| 5,459,000 A | 10/1995 | Unno | |
| 5,541,026 A | 7/1996 | Matsumoto | |
| 5,624,773 A | 4/1997 | Pforr et al. | |
| 5,703,675 A | 12/1997 | Hirukawa et al. | 355/53 |
| 5,808,796 A | 9/1998 | Kang et al. | 359/562 |
| 6,077,631 A * | 6/2000 | Unno | 430/5 |
| 6,249,335 B1 | 6/2001 | Hirukawa et al. | 355/53 |
| 6,496,239 B2 | 12/2002 | Seiberle | 349/98 |
| 6,866,968 B2 * | 3/2005 | Shin et al. | 430/5 |

(Continued)

FOREIGN PATENT DOCUMENTS

JP 08-110630 4/1996

(Continued)

*Primary Examiner*—Mark F Huff
*Assistant Examiner*—Stewart A Fraser
(74) *Attorney, Agent, or Firm*—Mills & Onello, LLP

(57) ABSTRACT

A photomask according to the invention provides selective regional optimization of illumination type according to the type of image being formed using the photomask. The photomask include a light polarizing structure which polarizes the light incident on the polarizing structure. Light of a first illumination type from a source in a photolithographic exposure system is incident on the photomask. A portion of the light is incident on the region of the photomask that includes the polarizing structure, and another portion of the light is incident on another region of the photomask that does not include a polarizing structure. The illumination type of the light incident on the polarizing structure is changed to a second illumination type such that light incident on a substrate such as an integrated circuit wafer from the region of the photomask that has the polarizing structure is of the second illumination type. The illumination type of the portion of the light that is not incident on the polarizing structure is not changed, such that light from that portion of the photomask incident on another region of the wafer is of the first illumination type. By selectively regionally controlling illumination type in the photolithography process, resolution of the exposure system is optimized in all regions of the wafer.

59 Claims, 26 Drawing Sheets

U.S. PATENT DOCUMENTS

| | | |
|---|---|---|
| 2002/0068227 A1* | 6/2002 | Wang et al. ............. 430/5 |
| 2002/0197541 A1* | 12/2002 | Grobman et al. ............. 430/5 |
| 2004/0010385 A1 | 1/2004 | Fukuhara et al. |
| 2004/0161677 A1* | 8/2004 | Nakao ............. 430/5 |
| 2004/0161678 A1* | 8/2004 | Misaka ............. 430/5 |
| 2004/0263816 A1 | 12/2004 | Van Dam |
| 2006/0177745 A1* | 8/2006 | Huh et al. ............. 430/5 |

FOREIGN PATENT DOCUMENTS

| | | |
|---|---|---|
| JP | 2001-272764 | 10/2001 |

* cited by examiner

US 7,629,087 B2

PHOTOMASK, METHOD OF MAKING A PHOTOMASK AND PHOTOLITHOGRAPHY METHOD AND SYSTEM USING THE SAME

RELATED APPLICATIONS

This application relies for priority on Korean Patent Application No. 10-2005-0051264, filed in the Korean Intellectual Property Office on Jun. 15, 2005, the entire contents of which are incorporated herein by reference.

FIELD OF THE INVENTION

The invention relates to photomasks and photolithography systems and methods and, more particularly, to a photomask and a method of making and using a photomask in a photolithography system and process in which resolution is enhanced.

BACKGROUND OF THE INVENTION

A photolithography system includes an illumination source which directs radiation such as light through a reticle or photomask onto a photosensitive material, such as photoresist, coated on a substrate, such as a semiconductor wafer, on which a pattern, such as a circuit pattern, is to be formed. As circuits have become more highly integrated, devices have become extremely small. Therefore, the patterns formed on the circuit wafer and, as a result, the corresponding patterns on photomasks or reticles used to make the circuit patterns, have also become extremely small. In order to produce such small patterns, the photolithography system must have extremely high resolution.

To improve feature resolution in a photolithography system, it has become important that the optics in the system gather as much light as possible from the source. With standard normal or vertical illumination in which the beam of radiation is incident on the photomask perpendicular or normal to the photomask, much of the light that is gathered by the exposure system and reaches the substrate is $0^{th}$-order light. To improve resolution, it is important to gather and direct higher orders of light generated by diffraction by the photomask pattern, and to direct these higher orders of light onto the photosensitive coating. Specifically, it is desirable to collect first-order light generated by diffraction by the photomask pattern and to illuminate the coating with the first-order light.

Off-axis illumination (OAI) by the source is one way to collect first-order light and direct it onto the wafer being exposed. OAI refers to an illumination shape that significantly reduces or eliminates the on-axis or vertical component of the illumination, that is, the light striking the photomask at near-normal incidence. By tilting the illumination away from normal incidence, the diffraction pattern of the mask is shifted within the objective lens of the exposure system, thus allowing more of the first-order light from the photomask to be directed onto the wafer.

FIG. 1 is a schematic functional diagram of an illumination system used in photolithography exposure processes. Referring to FIG. 1, the system 10 includes an illumination source 12, such as a high-power excimer laser, and conditioning optics for illuminating a photomask or reticle 26. The illuminated region of the mask 26 is imaged by the projection system onto the wafer (not shown). The laser source 12 directs a beam of illuminating radiation such as light 14 onto a beam shaping component 16. The beam shaper 16 is used to control the beam 14 to create an illumination beam 21 of a desired shape. In one particular configuration, the beam shaper 16 includes a deflective optical element (DOE) 18 and a lens 20. The shaped beam 21 from the beam shaper 16 is directed onto a uniformizer 22, which makes the light uniform throughout its entire shape. The condenser lens 24 collects the light and focuses it onto the reticle or photomask 26. The illumination shown in FIG. 1 is normal-incidence or vertical, on-axis illumination.

FIG. 2 contains a schematic diagram of a portion of a lithographic exposure system illustrating principles of lithographic exposure. Referring to FIG. 2, light is vertically incident to the photomask 26 on the back or bottom side of which are formed opaque light-screening patterns. After passing through and being diffracted by the fine mask patterns, the light is collected and transmitted by a projection lens 29 to a wafer 27 at which images of the patterns on the photomask are formed.

When such vertically incident light passes through the slits between the fine patterns on the photomask 26, it is diffracted and separated largely into $0^{th}$-order light and $1^{st}$-order light under the influence of the narrow width of the patterns. Almost all light rays coming from the large slit width patterns are $0^{th}$-order or $\pm 1^{st}$-order with a diffraction angle of θ1. Information about the mask is contained in $1^{st}$-order light. To resolve patterns, information about patterns should fall on and be collected by the lens 29. Referring to FIG. 2, under vertical illumination, much of the $\pm 1^{st}$-order light is not collected by the lens 29. This can result in reduced resolution of the system. If more of the $\pm 1^{st}$-order light were to fall on the lens 29, resolution would be improved.

FIG. 3 contains a schematic diagram further illustrating this diffraction effect in a photolithography exposure system 10. Referring to FIG. 3, the wafer 27 is mounted on a stage 41 in the system 10. The photomask 26 includes a pattern of opaque lines 40 separated by slits or spaces. Light is vertically incident to the photomask 26 on which the patterns 40 are formed. After passing through and being diffracted by the fine patterns 40, the light is transmitted from the projection lens 29 to the wafer 27 mounted on the stage 41 to form images of the pattern on the wafer 27.

As described above in connection with FIG. 2, when such vertically incident light passes through the slits between the patterns, it is diffracted and separated largely into $0^{th}$-order light and $\pm 1^{st}$-order light under the influence of the narrow width of the patterns. Almost all light rays coming from the comparatively larger slit width patterns are $0^{th}$-order or $1^{st}$ order with a diffraction angle of θ1. The light rays coming from finer slit width patterns are mostly $\pm 1^{st}$-order with a diffraction angle of θ2, which is greater than θ1, as illustrated in FIG. 3. That is, as the feature size and design pitch become smaller, the deflection angle of the $\pm 1^{st}$-order light increases. The $\pm 1^{st}$-order light has relatively high intensity, and a difference in optical path between the $0^{th}$-order light and the $\pm 1^{st}$-order light is created by the radius of curvature and focus distance of the projection lens 29, thus degrading image contrast and, therefore, resolution.

As the size of features on the photomask approaches or drops below the wavelength of the exposure illumination, diffraction effects become more pronounced. This can cause the first order of the diffracted image to fall outside the projection lens 29, thereby causing imaging problems, because both the zero and first diffraction orders must fall on the projection lens in order to properly resolve the image from the photomask.

FIG. 4 contains a schematic diagram illustrating the effect of off-axis illumination (OAI) on the diffraction effect in a photolithography exposure system 110. OAI refers to any illumination shape that significantly reduces or eliminates the on-axis component of illumination, that is, the light striking the photomask at normal or near-normal incidence. By tilting the illumination away from normal incidence, the diffraction pattern of the mask is shifted within the objective lens 29. More of the ±1$^{st}$-order light is collected and directed onto the photomask, and resolution is improved.

OAI improves resolution by illuminating the photomask with light off the optical axis of the stepper lens of the exposure system 110. The interaction of light at an angle, falling on the photomask structures that act as diffraction gratings, can improve the contrast of the image by transmitting more of the diffracted orders through the projection lens 29. That is, the deflection angle θ2 of the ±1$^{st}$-order light is reduced, such that more of the ±1$^{st}$-order light is used in imaging the photomask pattern on the wafer 27.

OAI is one of several major resolution enhancement approaches that have enabled optical lithography to advance practical resolution limits far beyond what was once thought possible. Other approaches include phase-shifting masks and optical proximity corrections. In order to effectively use OAI, the shape and size of the illumination must be optimized for the specific mask pattern being printed.

OAI involves symmetrically illuminating the photomask from more than one direction off the optical axis of the lithography system. The zero and first diffraction orders from each illumination point reach the lens with the symmetrical arrangement compensating for any shift in the image. Also, imaging errors in the horizontal-to-vertical line performance or aberrations in the projection lens may require asymmetrical illumination in order to compensate for the error, including adjusting the illumination balance throughout the illumination pattern, e.g., causing one pole to be of higher intensity than another, and/or adjusting the shape of the illumination pattern, e.g., the horizontal of the illumination pattern may be elongated to be larger than the vertical of the illumination pattern.

Various illumination modes may be utilized, depending on the pattern being formed and other factors. These modes include annular illumination and multipole illumination. Annular illumination may include a single ring, concentric rings, etc. Multipole illumination modes may include illumination patterns having any number of poles, including two (dipole illumination), four (quadrupole illumination), eight (octapole illumination), etc. The illumination mode used is very much dependent on the type of pattern being formed. For example, in the case of a line-and-space pattern, where offset of the illumination along only a single axis, e.g., x-axis, is needed, a dipole illumination shape can be used. For patterns more complex than line-and-space, where more than one axis of offset is needed, annular illumination can be used.

FIG. 5 is a schematic diagram of a typical semiconductor memory integrated circuit 150. The typical memory circuit 150 of FIG. 5 includes a memory cell region 151 and an adjacent peripheral circuit region 152 formed on a single circuit chip die. Generally, the memory cell region 151 has periodic line-and-space patterns, and the peripheral circuit region 152 has many unique patterns. Typically, when the memory circuit 150 is fabricated, exposure conditions are optimized for the circuits formed in the memory cell region 151. Therefore, the illumination mode used to fabricate the circuit 150 is selected according to the types of patterns in the memory cell region 151.

However, the illumination mode that is optimal for the memory cell region 151 typically will not be optimal for the peripheral circuit region 152, because the pattern types formed in the peripheral circuit region 152 are usually different and more complex than those formed in the memory cell region 151. For example, the memory cell region 151 is typically made up of periodic line-and-space patterns. Accordingly, a dipole illumination mode 153 is typically used for the exposure in the memory cell region 151. However, because the peripheral circuit region 152 includes more complex non-periodic circuitry of various shapes and sizes, dipole illumination is not optimal for the illumination in the region 152. Annular illumination 154 is more desirable for the peripheral circuit region 152. Therefore, if the same illumination type, e.g., dipole, is used for both regions 151 and 152, the resolution in region 152 will not be optimized.

In response to this, two illumination types can be used in exposing the memory cell region 151 and the peripheral circuit region 152. Specifically, dipole illumination 153 is used in exposing the memory cell region 151, and annular illumination 154 is used in exposing the peripheral circuit region 152. This is commonly accomplished by one of two possible approaches.

In a first approach, a two-step or double-exposure process is used. Under this approach, the memory cell region 151 is exposed first using dipole illumination 153. Then, in a second exposure step, the peripheral circuit region 152 is exposed using annular illumination 154. The order of the steps can be reversed. This approach has several drawbacks. It is time consuming and therefore inefficient and, therefore, suffers from low throughput. Also, it is difficult to overlay the regions and to stitch the regions together. As a result, this approach is not applicable to mass production applications.

Another approach uses a single exposure step which provides different illumination types simultaneously to the memory cell region 151 and the peripheral circuit region 152. FIG. 6 is a schematic diagram illustrating this approach. A shaped illumination from a source 12 is directed onto the photomask 226 having a pattern of opaque lines 227 made of an opaque material such as chrome formed on its bottom or back surface. The shaped illumination is typically of the annular type 154. The photomask 226 includes two regions 51 and 52. The illumination for the memory cell region 151 of the integrated circuit passes through the region 51 of the photomask 226, and the illumination of the peripheral circuit region 152 passes through the region 52 of the photomask 226. The photomask is fabricated to include a grating pattern 143 formed on the top surface of the photomask 226 in the region 51. The grating pattern 143 is formed to transform the annular illumination type 154 incident on the grating pattern 143 into dipole illumination type 153. As a result, the memory cell region 151 is illuminated with dipole illumination 153 and the peripheral circuit region 152 is simultaneously illuminated with annular illumination 154.

This approach also has several drawbacks. For example, the diffracted light passing through the back side of the photomask 226 under different illumination conditions overlaps at the boundary between the patterns for the two regions 51 and 52 at the back side of the photomask, as indicated by the dashed circle labeled "A" in FIG. 6. This results in an undesirable illumination condition at the boundary between the memory cell region 151 and the peripheral circuit region 152 on the integrated circuit. Generally, the diffracted light that passes through the back side of the photomask 226 is widely dispersed, resulting in low-quality pattern imaging and loss of spatial resolution.

SUMMARY OF THE INVENTION

The present invention provides an approach to improving spatial resolution in a photolithography exposure system.

According to the invention, various illumination conditions are simultaneously realized for multiple regions on a circuit being fabricated. According to the invention, a selectively regionally polarizing photomask includes a polarizing structure on its surface, in particular, its back surface. By selectively regionally polarizing the light passing through the photomask, illumination conditions for multiple regions of the circuit being fabricated are produced. Multiple regions of the circuit are exposed under different illumination conditions simultaneously. The invention provides regionally optimized illumination conditions with only a single exposure.

According to a first aspect, the invention is directed to a photomask. The photomask includes a substrate having a first region and a second region. A polarizing structure is formed in the substrate in one of the first and second regions, such that when radiation of a first illumination type impinges on the substrate and the polarizing structure, radiation of a second illumination type is formed in the one of the first and second regions and radiation of a third illumination type is formed in the other of the first and second regions.

In one embodiment, the first and third illumination types are the same.

In one embodiment, the first illumination type is azimuthal polarized illumination. The azimuthal polarized illumination can be azimuthal cross-pole illumination.

In one embodiment, the first illumination type is annular type illumination. Alternatively, the first illumination type can be quadrupole type illumination.

In one embodiment, the second illumination type is formed by the radiation passing through the first region. The first region can be a polarized region. The third illumination type can be the same as the first illumination type. In one embodiment, the second illumination type is dipole.

In one embodiment, the photomask further comprises a pattern formed on the substrate. The pattern can include chrome, and the polarizing structure can be formed in proximity to the pattern. The polarizing structure can be formed on a chrome side of the substrate.

In one embodiment, the polarizing structure comprises a pattern of grooves formed in the substrate.

In one embodiment, the substrate comprises quartz.

According to another aspect, the invention is directed to a method of making a photomask, the method comprising: providing a substrate having a first region and a second region; and forming a polarizing structure in the substrate in one of the first and second regions, such that when radiation of a first illumination type impinges on the substrate and the polarizing structure, radiation of a second illumination type is formed in the one of the first and second regions and radiation of a third illumination type is formed in the other of the first and second regions.

In one embodiment, the first and third illumination types are the same.

In one embodiment, the first illumination type is azimuthal polarized illumination. The azimuthal polarized illumination can be azimuthal cross-pole illumination.

In one embodiment, the first illumination type is annular type illumination. Alternatively, the first illumination type can be quadrupole type illumination.

In one embodiment, the second illumination type is formed by the radiation passing through the first region. The first region can be a polarized region. The third illumination type can be the same as the first illumination type. The second illumination type can be dipole.

In one embodiment, the method further comprises forming a pattern on the substrate. The pattern can comprise chrome. The polarizing structure can be formed in proximity to the pattern. The polarizing structure can be formed on the surface of a chrome side of the substrate.

In one embodiment, the polarizing structure comprises a pattern of grooves formed in the substrate.

In one embodiment, the substrate comprises quartz.

In one embodiment, the method further comprises: forming a layer of opaque material over the substrate; patterning the layer of opaque material to form a pattern on the substrate; forming a layer of transparent material over the pattern; and patterning the transparent material to form the polarizing structure in proximity to the pattern. The substrate can be made of the transparent material, and the transparent material can comprise quartz. The opaque material can comprise chrome.

In one embodiment, the method further comprises: patterning the substrate to form the polarizing structure; forming a layer of opaque material over the substrate with the polarizing structure; and patterning the opaque material to form a pattern in proximity to the polarizing structure. The opaque material can comprise chrome.

In one embodiment, the method further comprises: forming a layer of opaque material over the substrate; patterning the layer of opaque material to form a pattern on the substrate, such that a portion of the substrate is exposed; and patterning the exposed portion of the substrate to form the polarizing structure in proximity to the pattern. The opaque material can comprise chrome.

According to another aspect, the invention is directed to a photolithography method used in fabricating a circuit, the method comprising: positioning a photomask over a semiconductor substrate on which the circuit is to be formed, the circuit having first and second regions corresponding to first and second regions of the photomask, the photomask having a polarizing structure formed in one of the first and second regions of the photomask; and illuminating the photomask with radiation of a first illumination type, such that radiation of a second illumination type impinges on the one of the first and second regions of the substrate corresponding to the one of the first and second regions of the photomask, and radiation of a third illumination type impinges on the other of the first and second regions of the substrate.

In one embodiment, the circuit is a memory circuit. In one embodiment, the circuit is a DRAM circuit. The first region of the circuit can comprise memory cells, and the second region of the circuit can comprise peripheral circuitry.

In one embodiment, the first and third illumination types are the same.

In one embodiment, the first illumination type is azimuthal polarized illumination. The azimuthal polarized illumination can be azimuthal cross-pole illumination.

In one embodiment, the first illumination type is annular type illumination. Alternatively, the first illumination type can be quadrupole type illumination. The second illumination type can be formed by the radiation passing through the first region. The first region can be a polarized region. In one embodiment, the third illumination type is the same as the first illumination type. The second illumination type can be dipole.

According to another aspect, the invention is directed to a photomask, comprising: a substrate having a first region and a second region; and a polarizing structure formed in the substrate in one of the first and second regions. The polarizing structure is formed on the surface of a chrome side of the substrate.

According to another aspect, the invention is directed to a method of making a photomask, the method comprising: providing a substrate having a first region and a second region; and forming a polarizing structure in the substrate in one of the first and second regions. The polarizing structure is formed on the surface of a chrome side of the substrate.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 21 contains a schematic perspective view of a first type and a second type of photomask in accordance with the invention. FIG. 22 contains a schematic perspective view of a third type of photomask in accordance with the invention.

DETAILED DESCRIPTION OF PREFERRED EMBODIMENTS OF THE INVENTION

According to the invention, a polarizing structure is formed on a photomask to regionally alter the type of illumination that impinges on the photomask where the polarizing structure is formed.

Figure 1:
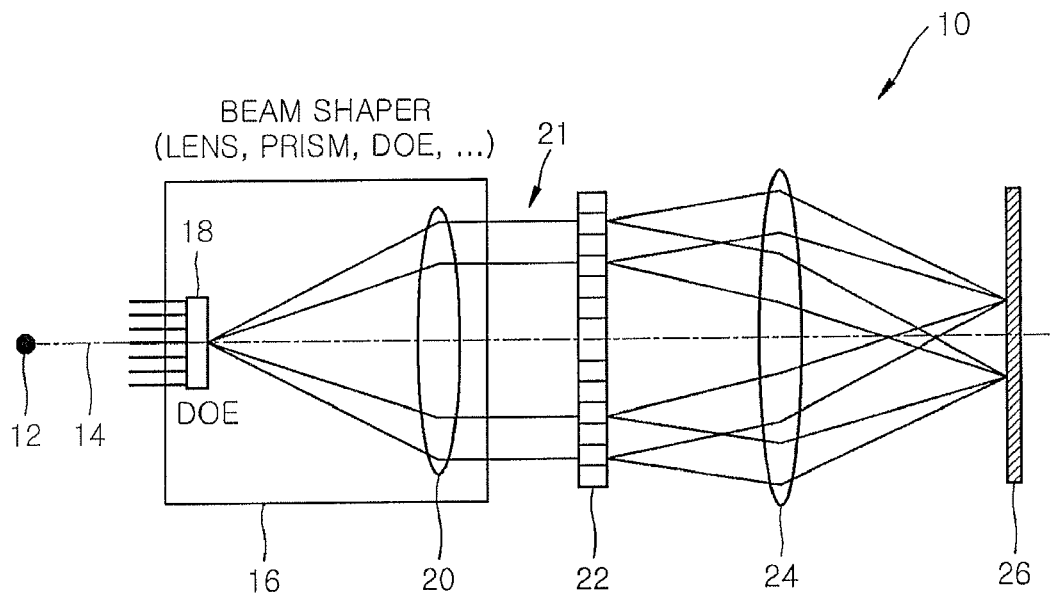
FIG. 1 is a schematic functional diagram of an illumination system used in photolithography exposure processes.
Figure 2:
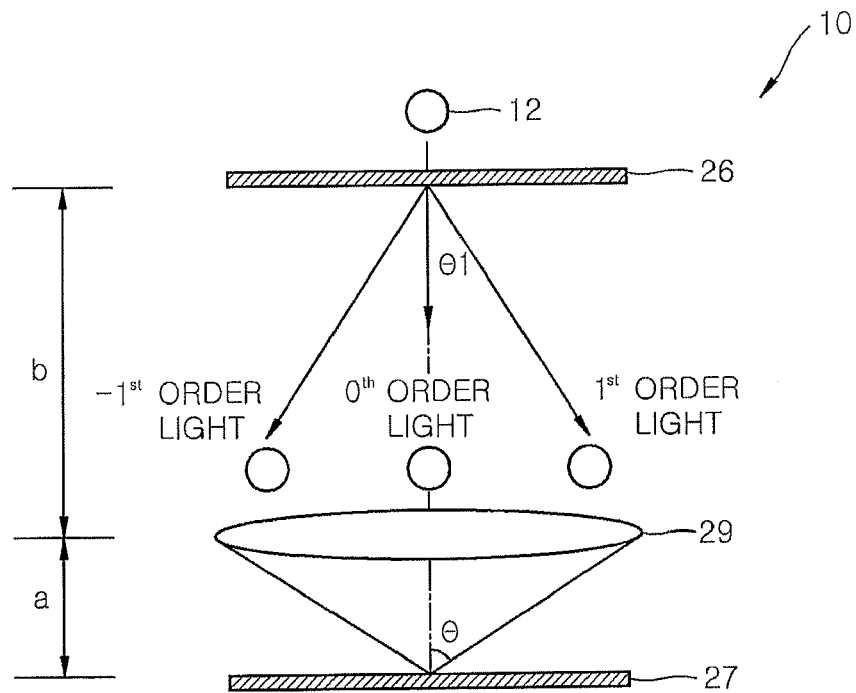
FIG. 2 contains a schematic diagram of a portion of a lithographic exposure system illustrating principles of lithographic exposure.
Figure 3:
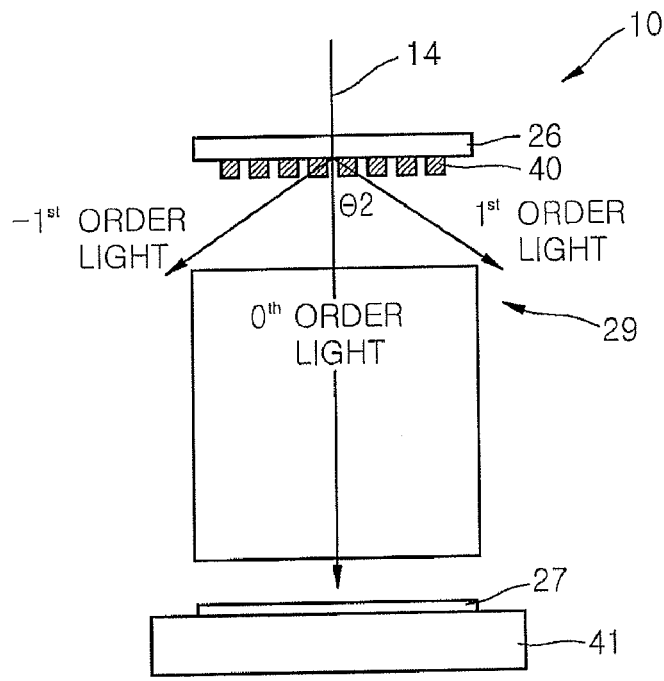
FIG. 3 contains a schematic diagram further illustrating the diffraction effect in a photolithography exposure system FIG. 4 contains a schematic diagram illustrating the effect of off-axis illumination (OAI) on the diffraction effect in a photolithography exposure system.
Figure 4:
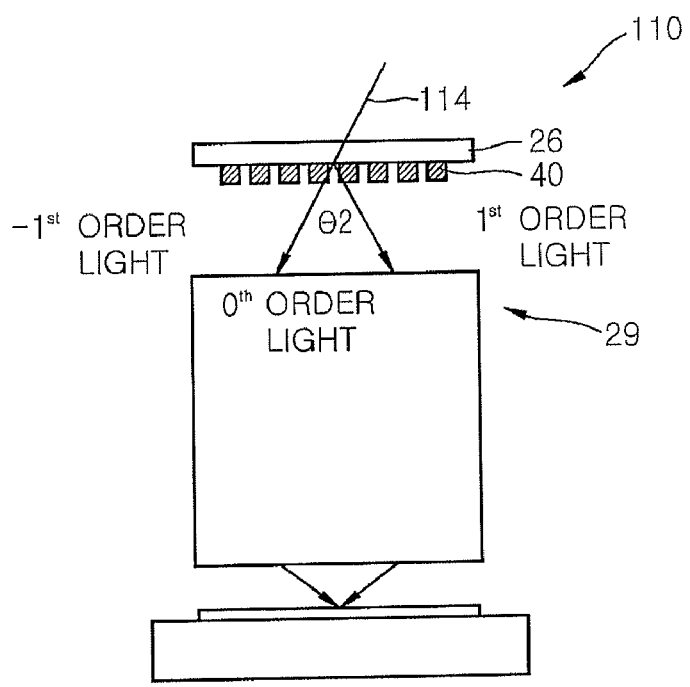
Figure 5:
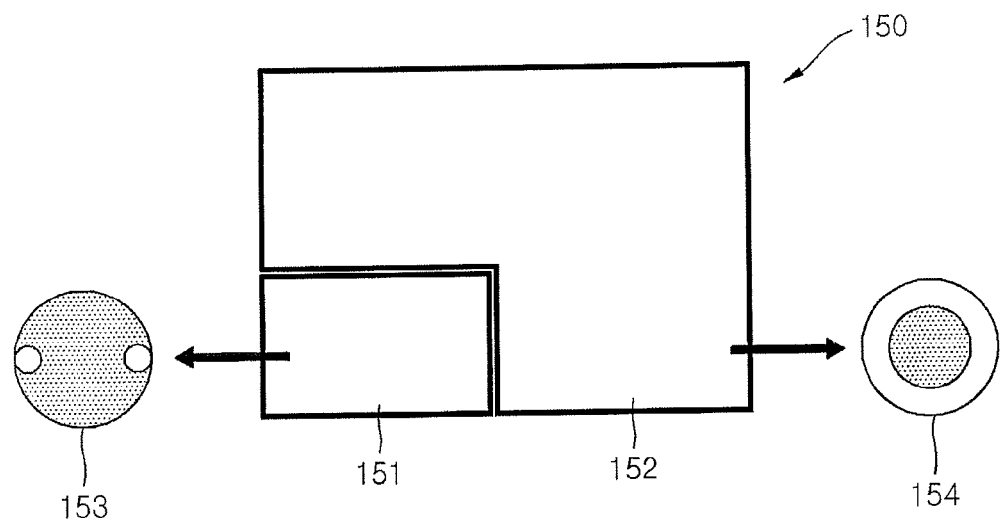
FIG. 5 is a schematic diagram of a typical semiconductor memory integrated circuit.
Figure 6:
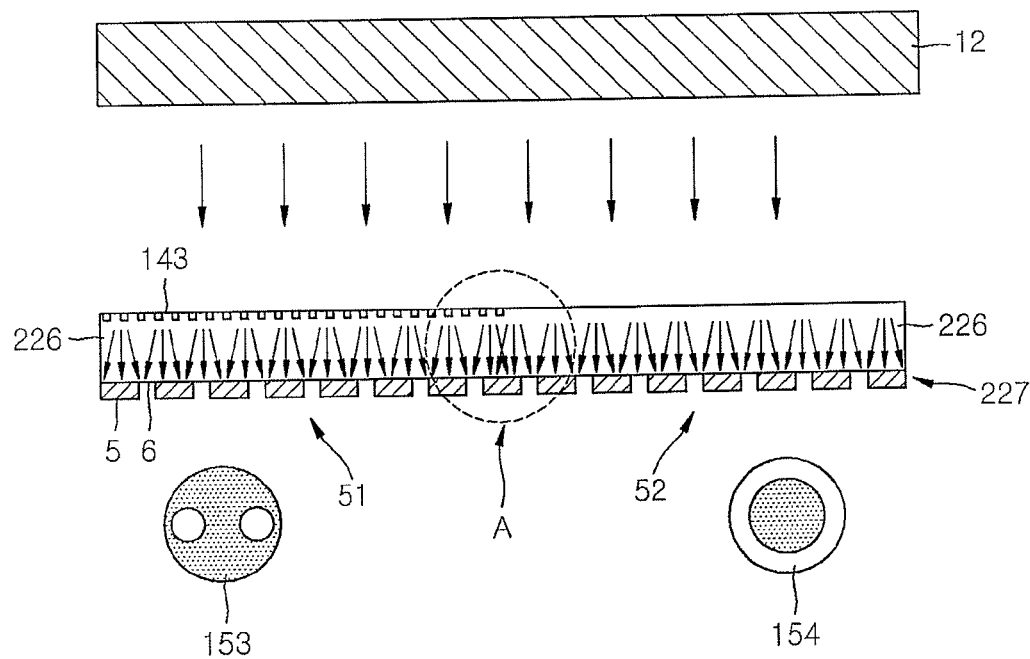
FIG. 6 is a schematic diagram of a photolithography system utilizing a conventional approach to improving resolution.
Figure 7:
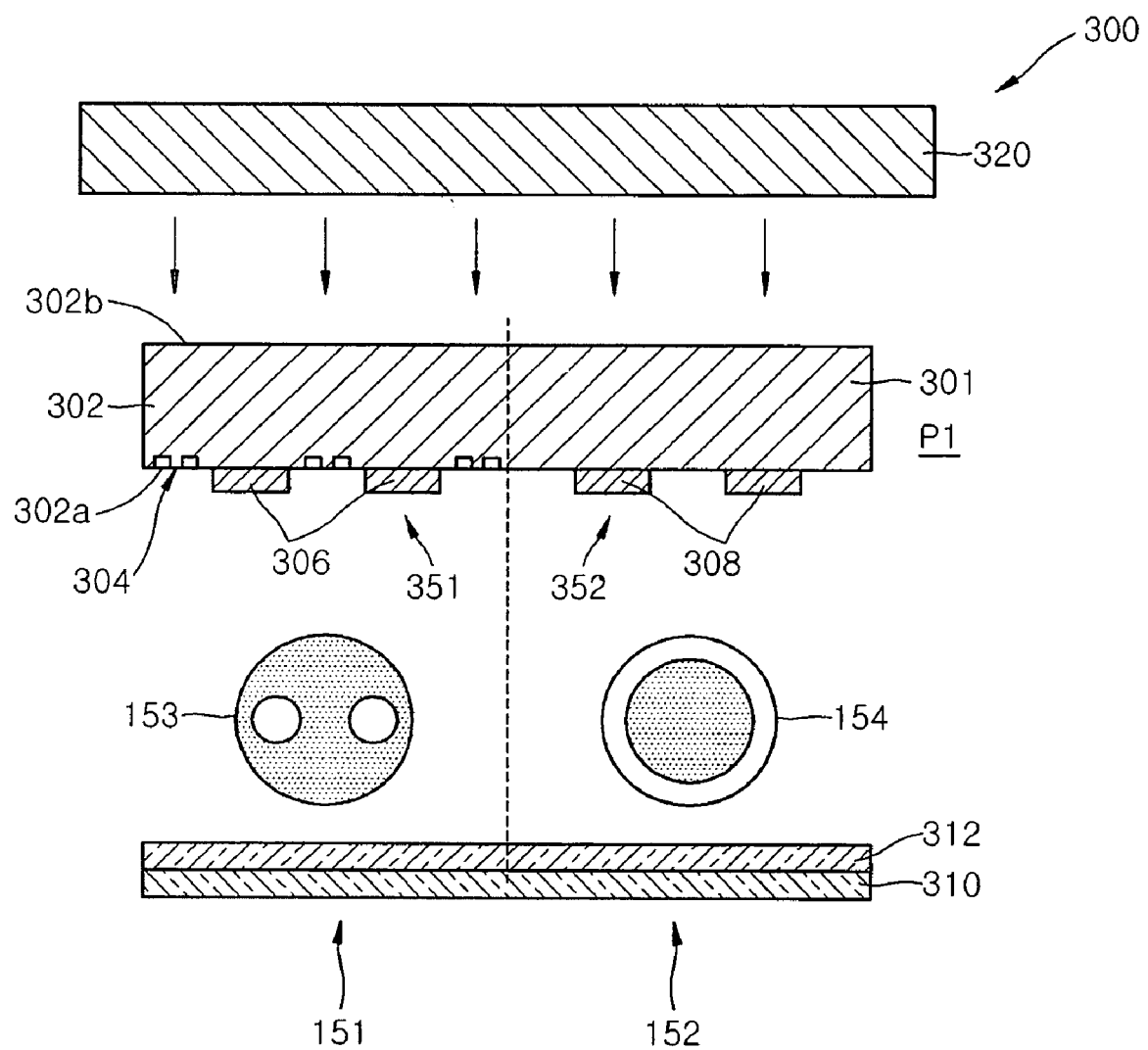
FIG. 7 is a schematic view illustrating a photolithography exposure system using a photomask in accordance with the invention.

FIG. 7 is a schematic view illustrating a photolithography exposure system 300 using a photomask 301 in accordance with the invention. Referring to FIG. 7, a light source 320, having an annular illumination type 154, such as azimuthal cross-pole illumination, directs light onto the photomask 301. The photomask 301 includes a transparent substrate 302 made of a material such as quartz. The shaped light is incident upon a top or front surface 302b of the substrate 302. Patterns of opaque lines 306 and 308, made of a material such as chrome, are formed on the bottom or back surface 302a of the substrate 302. The system 300 images the pattern 306 and 308 onto the layer of photoresist 312 formed on the wafer 310 being processed. The wafer 310 includes a memory cell region 151 on which memory cells are formed and a peripheral circuit region 152 on which peripheral circuits are formed. The photomask 301 includes two regions 351 and 352. In one embodiment, the illumination used in exposing the memory cell region 151 of the integrated circuit being fabricated passes through the region 351 of the photomask 301, and the illumination used in exposing the peripheral circuit region 152 of the integrated circuit passes through the region 352 of the photomask 301.

According to the invention, region 351 of the photomask substrate 302 includes a polarization pattern 304 formed on its back side. The polarization pattern 304 includes a periodic pattern of grooves which are formed by etching the pattern in the quartz substrate 302. The depth, width and pitch (period) of the grooves are selected considering the wavelength of the illuminating light. The polarization pattern 304 alters the illumination type of the light incident on region 351 of the photomask 301 such that the illumination type of the light exiting through the back side 302a of the photomask substrate 302 in the region 351 and impinging on region 151 of the photoresist layer 312 formed on the wafer 310 is different from the illumination type of the light incident on the top side 302b of the substrate 302. Specifically, where the illumination from the source is azimuthal annular illumination, the light leaving the back side of region 351 of the photomask 301 can be dipole illumination.

Light is a combination of both a transverse electric field and a transverse magnetic field. The electric field, i.e., the TE field, and the magnetic field, i.e., the TM field, vibrate in phase perpendicular to each other and to the direction of propagation. Any beam of light can be broken into these two parts.

Polarized light waves are light waves in which the vibrations occur in a single plane. The process of transforming unpolarized light into polarized light is known as polarization. TE polarization is defined as polarization perpendicular to the plane of incidence. Radiation polarized in the plane of incidence is referred to as TM polarized. According to the invention, plane waves are incident on the photomask with the polarizing structure formed thereon at perpendicular incidence. Regarding TE polarization, where the line pattern of the grooves in the polarizing structure is parallel to a y-axis as defined herein, the polarized E field of the diffraction orders is parallel to the y-axis. Regarding TM polarization, the polarized E field is initially parallel to the x-axis, but the first diffraction orders acquire a z component as they propagate to the photoresist and wafer being processed.

Figure 8:
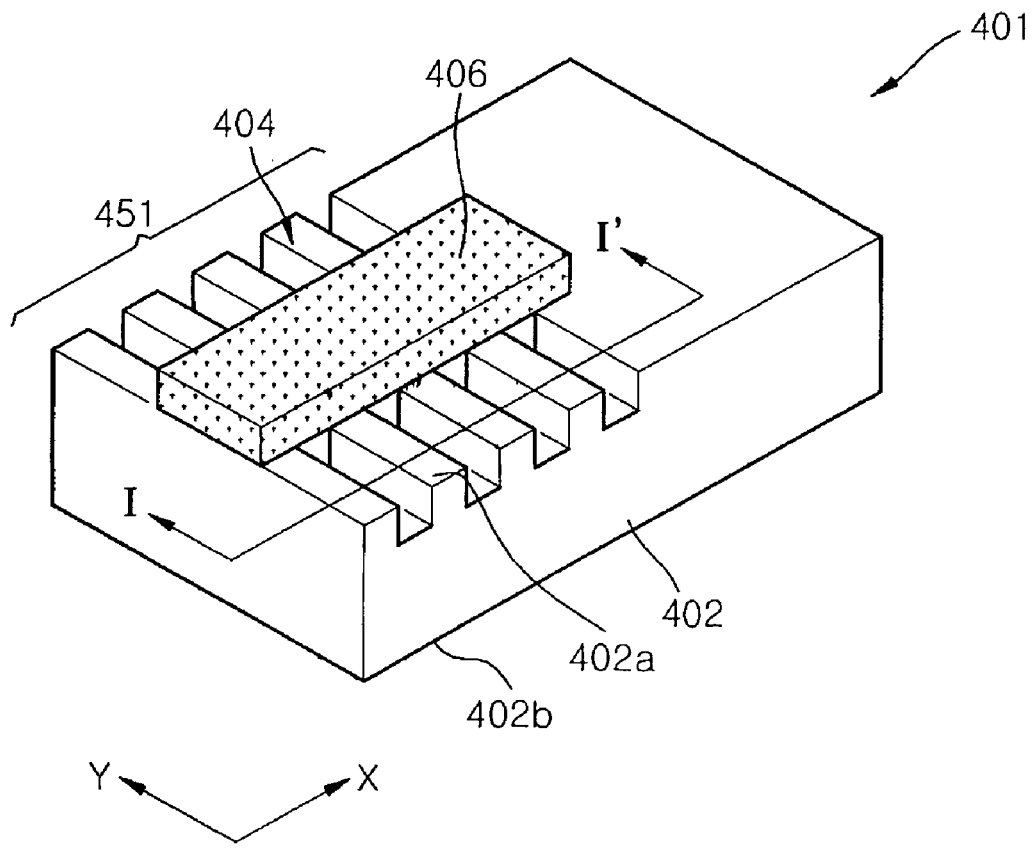
FIG. 8 is a schematic perspective view of a portion of a photomask with a polarizing structure formed in a region of a photomask substrate, according to an embodiment of the invention.

FIG. 8 is a schematic perspective view of a portion of a photomask 401 with a polarizing structure 404 formed in a region 451 of the substrate 402, according to an embodiment of the invention. The substrate 402 includes a front surface 402b and a back surface 402a in which the polarizing structure 404 is formed. As shown, the polarizing structure 404 includes a pattern of parallel grooves which extend parallel to the y-axis. The grooves of the polarizing structure 404 are formed in proximity to and on opposite sides of the opaque chrome pattern line 406. The opaque line 406 is one of many lines used in forming a circuit pattern on a wafer. Although not shown in the drawing of FIG. 8, the photomask 401 would actually include many opaque lines 406 forming a pattern to be imaged by the photolithography exposure system to image the photomask pattern on the integrated circuit being fabricated.

Figure 9:
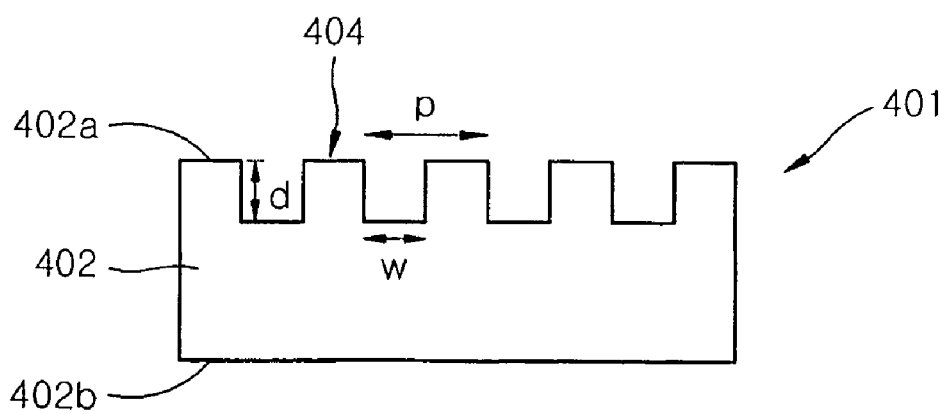
FIG. 9 is a schematic cross-sectional view of a portion of the photomask of FIG. 8, taken along line I-I' of FIG. 8.

FIG. 9 is a schematic cross-sectional view of a portion of the photomask 401 of FIG. 8, taken along line I-I' of FIG. 8. Referring to FIG. 9, the grooves of the polarizing pattern 404 are characterized by a depth d, a width w and a pitch or period p. These parameters are all selected based on the light being polarized, in particular, the wavelength $\lambda$ of the light being polarized.

Figure 10A:
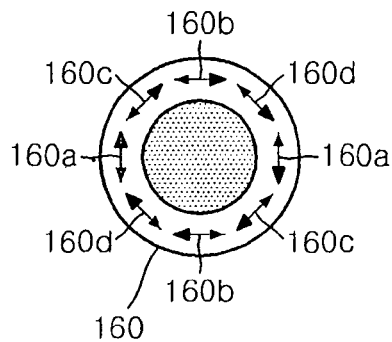
FIGS. 10A through 10C schematically illustrate the function of the photomask of FIG. 8 according to the invention when the polarizing structure of the photomask is illuminated with azimuthal annular illumination.
Figure 10B:
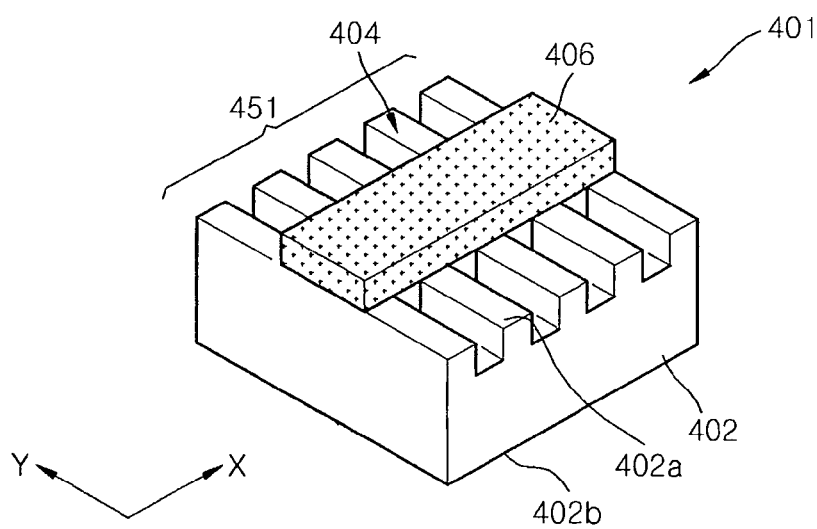
Figure 10C:
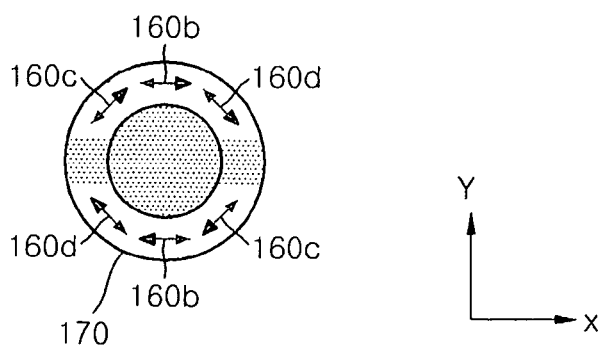

FIGS. 10A through 10C schematically illustrate the function of the photomask of FIG. 8 according to the invention when the polarizing structure of the photomask is illuminated with azimuthal annular illumination. Specifically, FIG. 10B contains a schematic perspective view of the portion of the photomask 401 containing the polarization structure 404. FIG. 10A schematically illustrates azimuthal annular illumination used to illuminate the photomask 401 during a photolithographic exposure. FIG. 10C schematically illustrates selective y-dipole illumination 170 created by the polarizing structure 404 from the azimuthal annular illumination 160 incident on the front surface 402b of the photomask 401. The selective y-dipole illumination 170 of FIG. 10C is emitted by the photomask 401 at its back side 402a and is used, in one embodiment, to illuminate the memory cell region of an integrated circuit during a photolithographic exposure.

The photomask 401 is a selective x-polarizer. Referring to FIG. 10A, the azimuthal annular illumination 160 from the light source of the exposure system includes a plurality of paired poles on opposite sides of an annular ring of illumination 160. Specifically, FIG. 10A illustrates four pairs of poles 160a, 160b, 160c and 160d located opposite each other on the annular ring 160.

When the azimuthal annular illumination 160 of FIG. 10A is incident on and passes through the selective x-polarizer photomask 401 of FIG. 10B, the selective y-dipole illumination 170 of FIG. 10C is generated. In one embodiment, the selective y-dipole illumination 170 of FIG. 10C is used to illuminate the memory cell region of an integrated circuit during an exposure step of a photolithographic process. Referring to FIG. 10C, the selective y-dipole illumination 170 includes only three pairs of poles 160b, 160c and 160d. The pair of poles 160a has been removed by the polarizing structure 404 of the photomask 401.

Figure 11A:
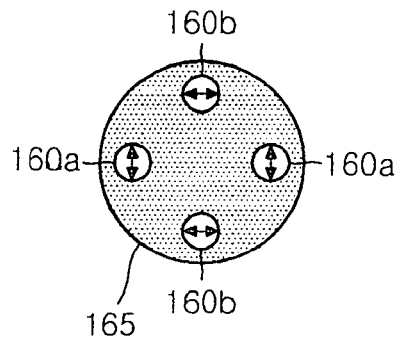
FIGS. 11A through 11C schematically illustrate the function of the photomask of FIG. 8 according to the invention when the polarizing structure of the photomask is illuminated with azimuthal annular illumination.
Figure 11B:
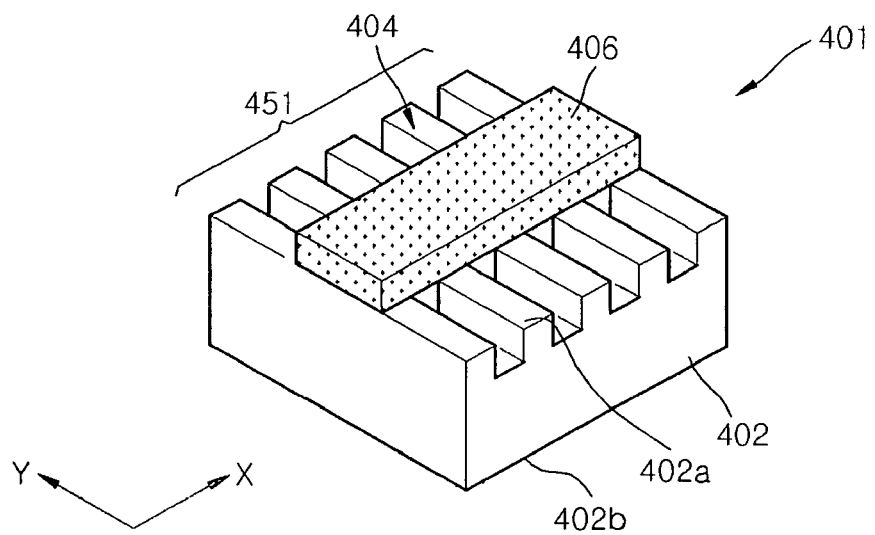
Figure 11C:
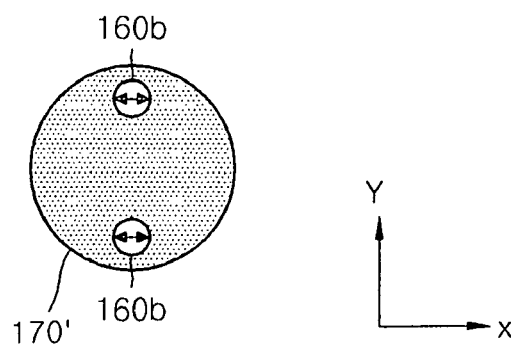

FIGS. 11A through 11C schematically illustrate the function of the photomask of FIG. 8 according to the invention when the polarizing structure of the photomask is illuminated with azimuthal annular illumination. Specifically, FIG. 11B contains a schematic perspective view of the portion of the photomask 401 containing the polarization structure 404. FIG. 11A schematically illustrates azimuthal annular illumination 165 used to illuminate the photomask 401 during a photolithographic exposure. FIG. 11C schematically illustrates selective y-dipole illumination 170' created by the polarizing structure 404 from the azimuthal annular illumination 165 incident on the front surface 402b of the photomask 401. The selective y-dipole illumination 170' of FIG. 11C is emitted by the photomask 401 at its back side 402a and is used, in one embodiment, to illuminate the memory cell region of an integrated circuit during a photolithographic exposure.

The photomask 401 is a selective x-polarizer. Referring to FIG. 11A, the azimuthal annular illumination 165 from the light source of the exposure system includes a plurality of paired poles on opposite sides of an annular ring of illumination 165. Specifically, FIG. 11A illustrates two pairs of poles 160a and 160b located opposite each other on the annular ring 165.

When the azimuthal annular illumination 165 of FIG. 11A is incident on and passes through the selective x-polarizer photomask 401 of FIG. 11B, the selective y-dipole illumination 170' of FIG. 11C is generated. In one embodiment, the selective y-dipole illumination 170' of FIG. 11C is used to illuminate the memory cell region of an integrated circuit during an exposure step of a photolithographic process. Referring to FIG. 11C, the selective y-dipole illumination 170' includes only one pair of poles 160b. The pair of poles 160a has been removed by the polarizing structure 404 of the photomask 401.

Figure 12:
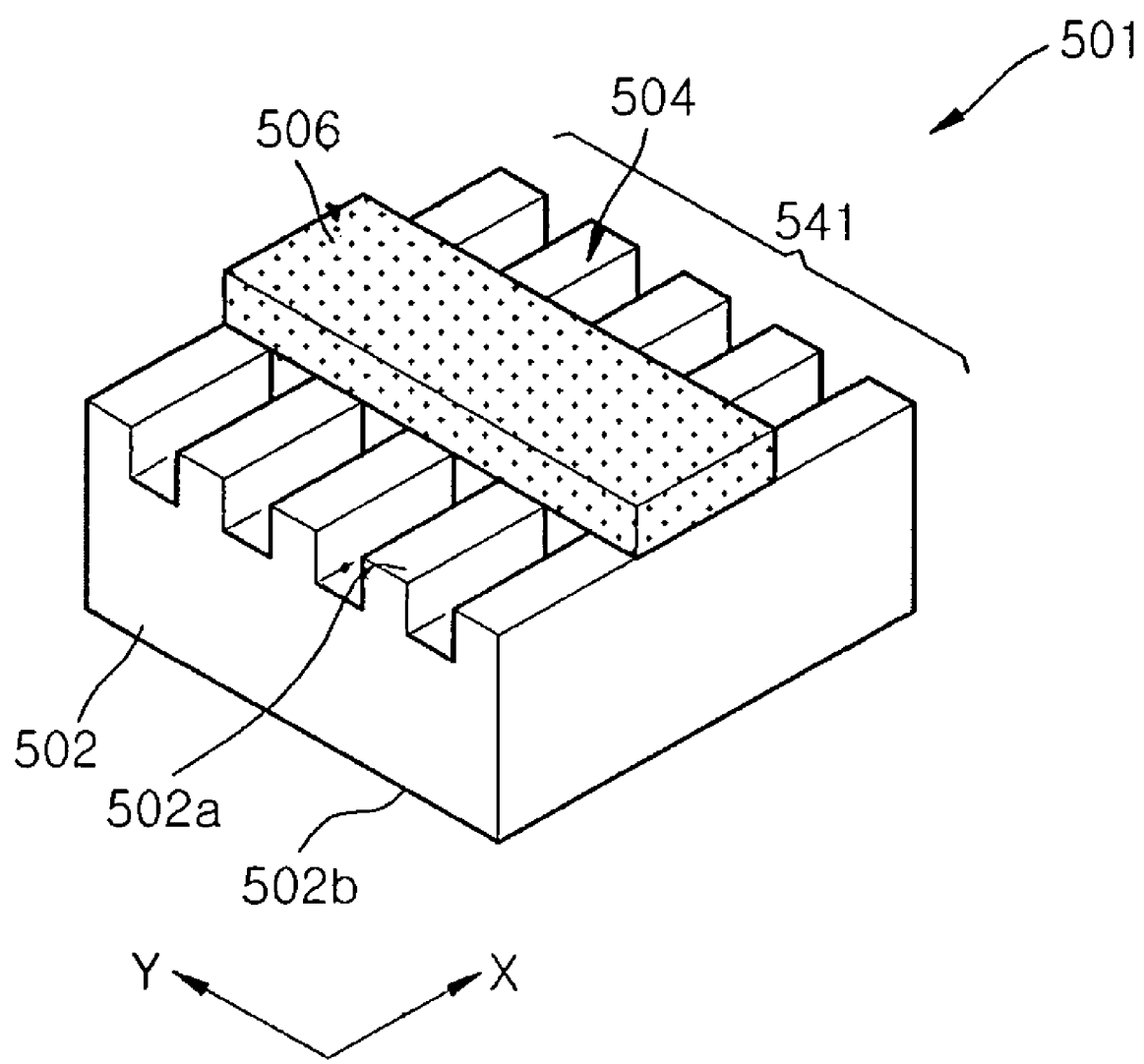
FIG. 12 is a schematic perspective view of a portion of a photomask with a polarizing structure formed in a region of a photomask substrate, according to another embodiment of the invention.

FIG. 12 is a schematic perspective view of a portion of a photomask 501 with a polarizing structure 504 formed in a region 541 of the substrate 502, according to another embodiment of the invention. The substrate 502 includes a front surface 502b and a back surface 502a in which the polarizing structure 504 is formed. As shown, the polarizing structure 504 includes a pattern of parallel grooves which extend parallel to the x-axis. The grooves of the polarizing structure 504 are formed in proximity to and on opposite sides of the opaque chrome pattern line 506. The opaque line 506 is one of many lines used in forming a circuit pattern on a wafer. Although not shown in the drawing of FIG. 12, the photomask 501 would actually include many opaque lines 506 forming a pattern to be imaged by the photolithography exposure system to image the photomask pattern on the integrated circuit being fabricated.

Figure 13A:
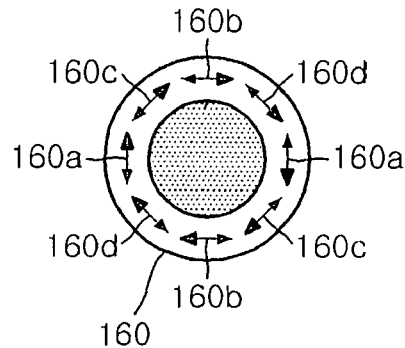
FIGS. 13A through 13C schematically illustrate the function of the photomask of FIG. 12 according to the invention when the polarizing structure of the photomask is illuminated with azimuthal annular illumination.
Figure 13B:
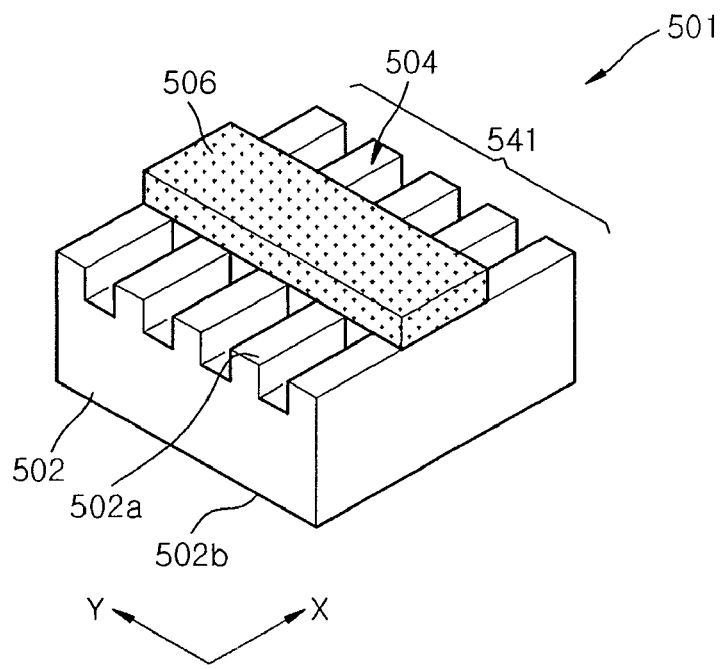
Figure 13C:
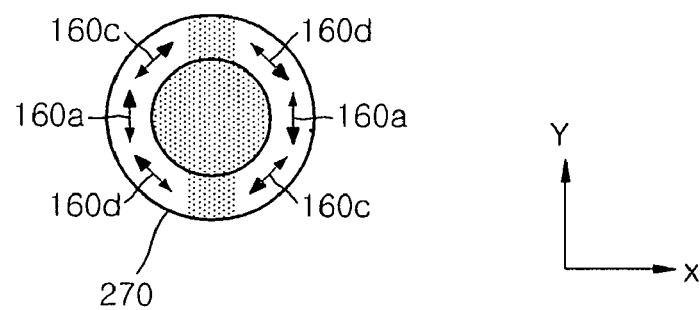

FIGS. 13A through 13C schematically illustrate the function of the photomask of FIG. 12 according to the invention when the polarizing structure of the photomask is illuminated with azimuthal annular illumination. Specifically, FIG. 13B contains a schematic perspective view of a portion of the photomask 501 containing the polarization structure 504. FIG. 13A schematically illustrates azimuthal annular illumination 160 used to illuminate the photomask 501 during a photolithographic exposure. FIG. 13C schematically illustrates selective x-dipole illumination 270 created by the polarizing structure 504 from the azimuthal annular illumination 160 incident on the front surface 502b of the photomask 501. The selective x-dipole illumination 270 of FIG. 13C is emitted by the photomask 501 at its back side 502a and is used, in one embodiment, to illuminate the memory cell region of an integrated circuit during a photolithographic exposure.

The photomask 501 is a selective y-polarizer. Referring to FIG. 13A, the azimuthal annular illumination 160 from the light source of the exposure system includes a plurality of paired poles on opposite sides of an annular ring of illumination 160. Specifically, FIG. 13A illustrates four pairs of poles 160a, 160b, 160c and 160d located opposite each other on the annular ring 160.

When the azimuthal annular illumination 160 of FIG. 13A is incident on and passes through the selective y-polarizer photomask 501 of FIG. 13B, the selective x-dipole illumination 270 of FIG. 13C is generated. In one embodiment, the selective x-dipole illumination 270 of FIG. 13C is used to illuminate the memory cell region of an integrated circuit during an exposure step of a photolithographic process. Referring to FIG. 13C, the selective x-dipole illumination 270 includes only three pairs of poles 160a, 160c and 160d. The pair of poles 160b has been removed by the polarizing structure 504 of the photomask 501.

Figure 14A:
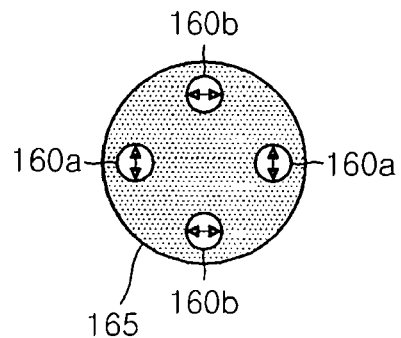
FIGS. 14A through 14C schematically illustrate the function of the photomask of FIG. 12 according to the invention when the polarizing structure of the photomask is illuminated with azimuthal annular illumination.
Figure 14B:
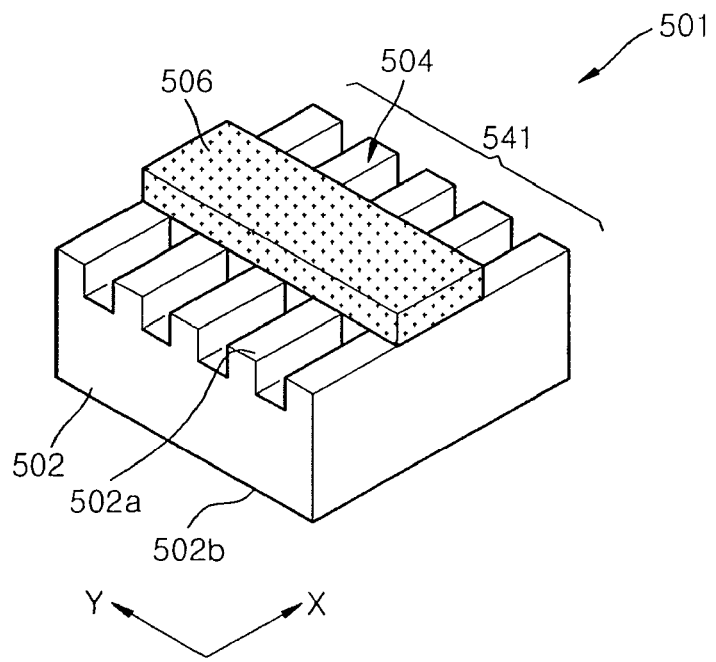
Figure 14C:
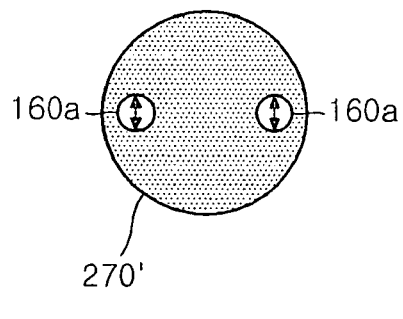

FIGS. 14A through 14C schematically illustrate the function of the photomask 501 of FIG. 12 according to the invention when the polarizing structure 504 of the photomask is illuminated with azimuthal annular illumination 165. Specifically, FIG. 14B contains a schematic perspective view of the portion of the photomask 501 containing the polarization structure 504. FIG. 14A schematically illustrates azimuthal annular illumination 165 used to illuminate the photomask 501 during a photolithographic exposure. FIG. 14C schematically illustrates selective x-dipole illumination 270' created by the polarizing structure 504 from the azimuthal annular illumination 165 incident on the front surface 502b of the photomask 501. The selective x-dipole illumination 270' of FIG. 14C is emitted by the photomask 501 at its back side 502a and is used, in one embodiment, to illuminate the memory cell region of an integrated circuit during a photolithographic exposure.

The photomask 501 is a selective y-polarizer. Referring to FIG. 14A, the azimuthal annular illumination 165 from the light source of the exposure system includes a plurality of paired poles on opposite sides of an annular ring of illumination 165. Specifically, FIG. 14A illustrates two pairs of poles 160a and 160b located opposite each other on the annular ring 165.

When the azimuthal annular illumination 165 of FIG. 14A is incident on and passes through the selective y-polarizer photomask 501 of FIG. 14B, the selective x-dipole illumination 270' of FIG. 14C is generated. In one embodiment, the selective x-dipole illumination 270' of FIG. 14C is used to illuminate the memory cell region of an integrated circuit during an exposure step of a photolithographic process. Referring to FIG. 14C, the selective x-dipole illumination 270' includes only one pair of poles 160a. The pair of poles 160b has been removed by the polarizing structure 504 of the photomask 501.

Figure 15:
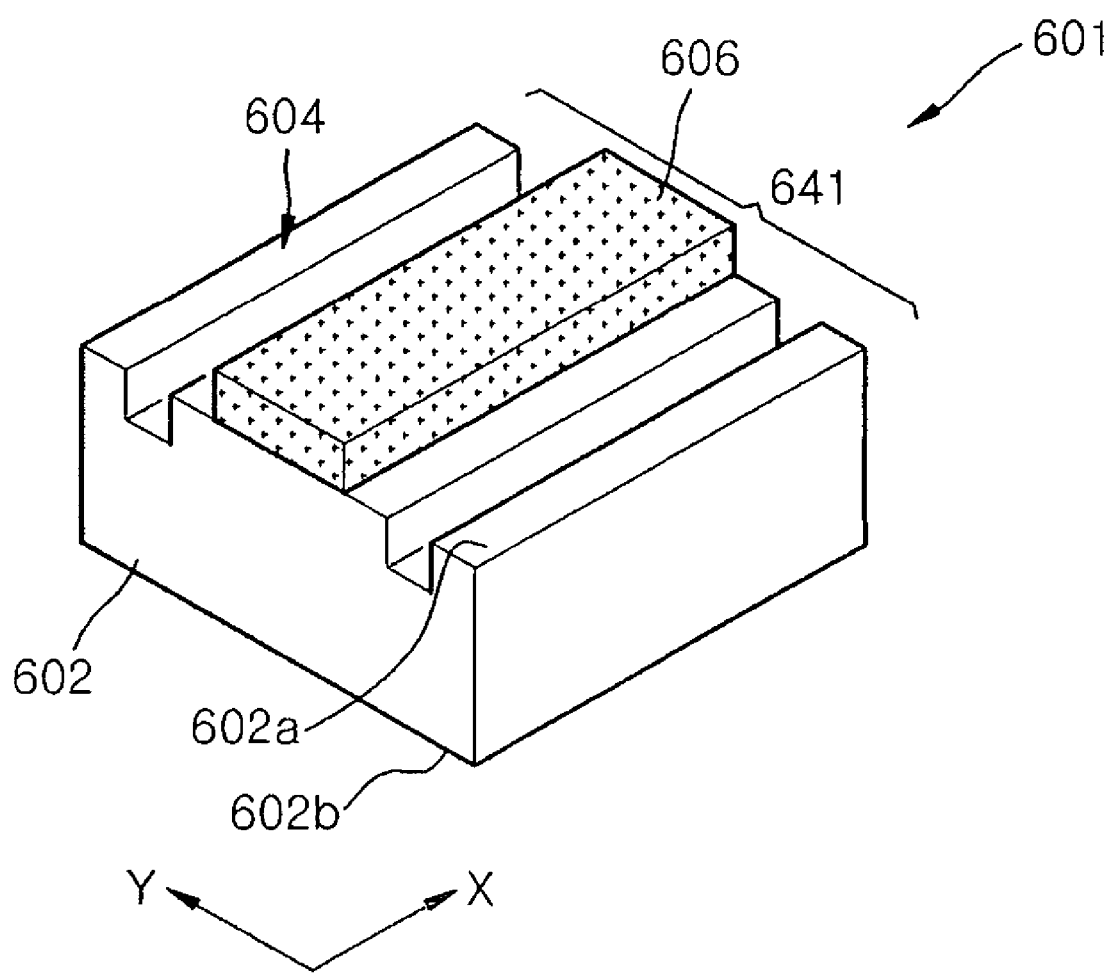
FIG. 15 is a schematic perspective view of a portion of a photomask with a polarizing structure formed in a region of a photomask substrate, according to another embodiment of the invention.

FIG. 15 is a schematic perspective view of a portion of a photomask 601 with a polarizing structure 604 formed in a region 641 of the substrate 602, according to another embodiment of the invention. The substrate 602 includes a front surface 602b and a back surface 602a in which the polarizing structure 604 is formed. As shown, the polarizing structure 604 includes a pattern of parallel grooves which extend parallel to the x-axis. The grooves of the polarizing structure 604 are formed in proximity to and on opposite sides of the opaque chrome pattern line 606. The opaque line 606 is one of many lines used in forming a circuit pattern on a wafer. Although not shown in the drawing of FIG. 15, the photomask 601 would actually include many opaque lines 606 forming a pattern to be imaged by the photolithography exposure system to image the photomask pattern on the integrated circuit being fabricated.

Figure 16A:
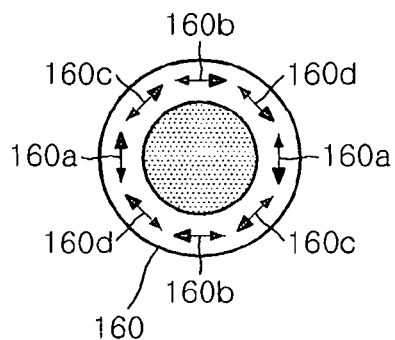
FIGS. 16A through 16C schematically illustrate the function of the photomask of FIG. 15 according to the invention when the polarizing structure of the photomask is illuminated with azimuthal annular illumination.
Figure 16B:
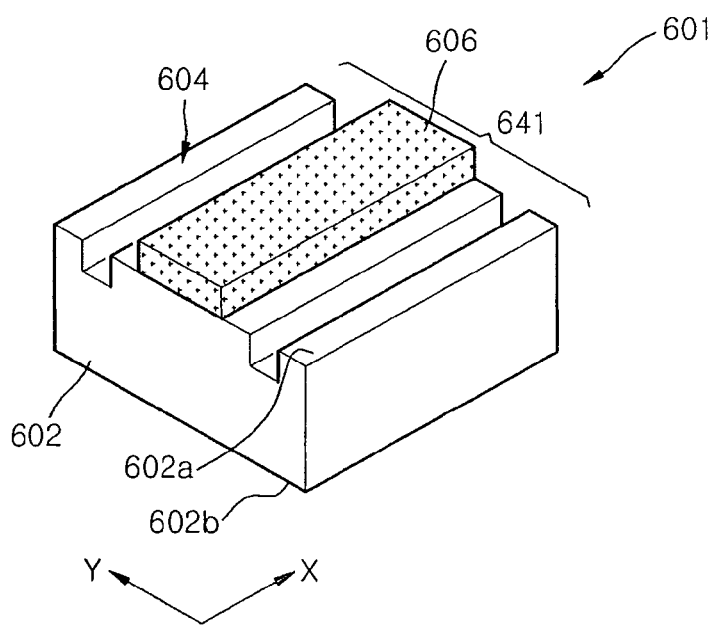
Figure 16C:
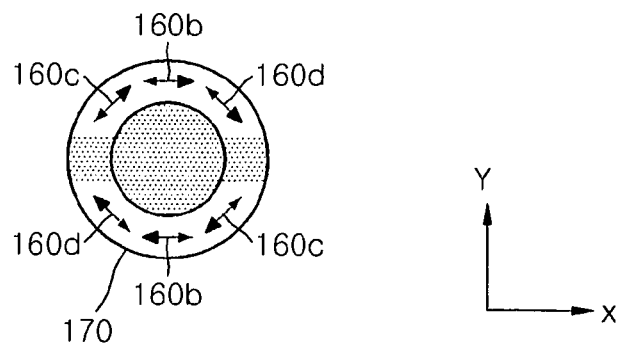

FIGS. 16A through 16C schematically illustrate the function of the photomask 601 of FIG. 15 according to the invention when the polarizing structure 604 of the photomask 601 is illuminated with azimuthal annular illumination 160. Specifically, FIG. 16B contains a schematic perspective view of a portion of the photomask 601 containing the polarization structure 604. FIG. 16A schematically illustrates azimuthal annular illumination 160 used to illuminate the photomask 601 during a photolithographic exposure. FIG. 16C schematically illustrates selective y-dipole illumination 170 created by the polarizing structure 604 from the azimuthal annular illumination 160 incident on the front surface 602b of the photomask 601. The selective y-dipole illumination 170 of FIG. 16C is emitted by the photomask 601 at its back side 602a and is used, in one embodiment, to illuminate the memory cell region of an integrated circuit during a photolithographic exposure.

The photomask 601 is a selective x-polarizer. Referring to FIG. 16A, the azimuthal annular illumination 160 from the light source of the exposure system includes a plurality of paired poles on opposite sides of an annular ring of illumination 160. Specifically, FIG. 16A illustrates four pairs of poles 160a, 160b, 160c and 160d located opposite each other on the annular ring 160.

When the azimuthal annular illumination 160 of FIG. 16A is incident on and passes through the selective x-polarizer photomask 601 of FIG. 16B, the selective y-dipole illumination 170 of FIG. 16C is generated. In one embodiment, the selective y-dipole illumination 170 of FIG. 16C is used to illuminate the memory cell region of an integrated circuit during an exposure step of a photolithographic process. Referring to FIG. 16C, the selective y-dipole illumination 170 includes only three pairs of poles 160b, 160c and 160d. The pair of poles 160a has been removed by the polarizing structure 604 of the photomask 501.

Figure 17A:
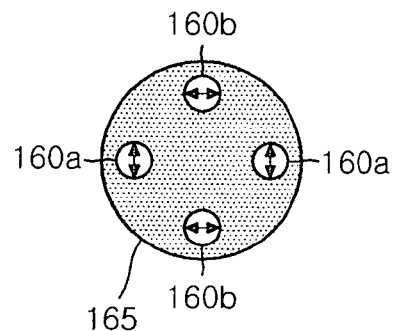
FIGS. 17A through 17C schematically illustrate the function of the photomask of FIG. 15 according to the invention when the polarizing structure of the photomask is illuminated with azimuthal annular illumination.
Figure 17B:
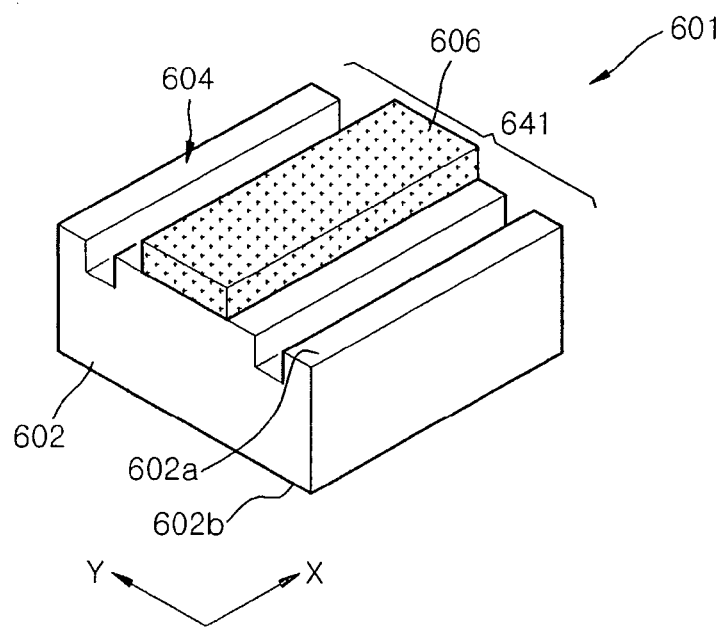
Figure 17C:
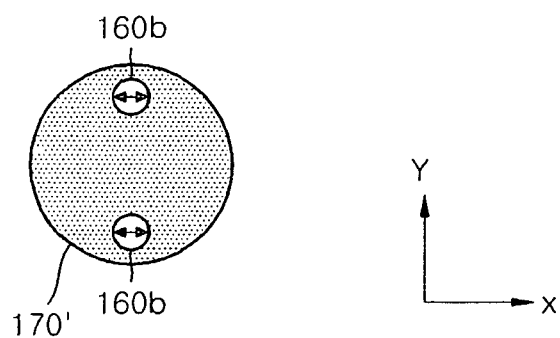

FIGS. 17A through 17C schematically illustrate the function of the photomask 601 of FIG. 15 according to the invention when the polarizing structure 604 of the photomask 601 is illuminated with azimuthal annular illumination 165. Specifically, FIG. 17B contains a schematic perspective view of the portion of the photomask 601 containing the polarization structure 604. FIG. 17A schematically illustrates azimuthal annular illumination 165 used to illuminate the photomask 601 during a photolithographic exposure. FIG. 17C schematically illustrates selective y-dipole illumination 170' created by the polarizing structure 604 from the azimuthal annular illumination 165 incident on the front surface 602b of the photomask 601. The selective y-dipole illumination 170' of FIG. 17C is emitted by the photomask 601 at its back side 602a and is used, in one embodiment, to illuminate the memory cell region of an integrated circuit during a photolithographic exposure.

The photomask 601 is a selective x-polarizer. Referring to FIG. 17A, the azimuthal annular illumination 165 from the light source of the exposure system includes a plurality of paired poles on opposite sides of an annular ring of illumination 165. Specifically, FIG. 17A illustrates two pairs of poles 160a and 160b located opposite each other on the annular ring 165.

When the azimuthal annular illumination 165 of FIG. 17A is incident on and passes through the selective x-polarizer photomask 601 of FIG. 17B, the selective y-dipole illumination 170' of FIG. 17C is generated. In one embodiment, the selective y-dipole illumination 170' of FIG. 17C is used to illuminate the memory cell region of an integrated circuit during an exposure step of a photolithographic process. Referring to FIG. 17C, the selective y-dipole illumination 170' includes only one pair of poles 160b. The pair of poles 160a has been removed by the polarizing structure 604 of the photomask 601.

Figure 18:
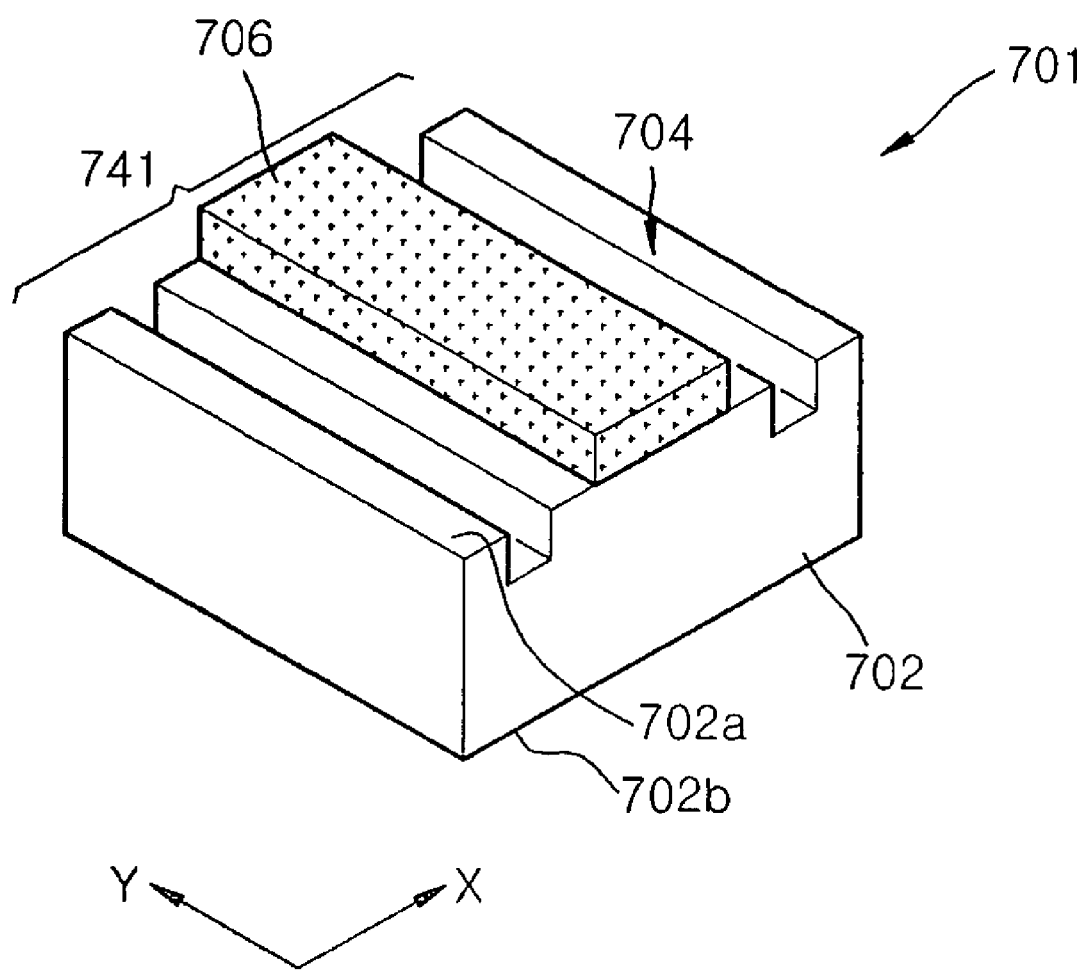
FIG. 18 is a schematic perspective view of a portion of a photomask with a polarizing structure formed in a region of a photomask substrate, according to another embodiment of the invention.

FIG. 18 is a schematic perspective view of a portion of a photomask 701 with a polarizing structure 704 formed in a region 741 of the substrate 702, according to another embodiment of the invention. The substrate 702 includes a front surface 702b and a back surface 702a in which the polarizing structure 704 is formed. As shown, the polarizing structure 704 includes a pattern of parallel grooves which extend parallel to the y-axis. The grooves of the polarizing structure 704 are formed in proximity to and on opposite sides of the opaque chrome pattern line 706. The opaque line 706 is one of many lines used in forming a circuit pattern on a wafer. Although not shown in the drawing of FIG. 18, the photomask 701 would actually include many opaque lines 706 forming a pattern to be imaged by the photolithography exposure system to image the photomask pattern on the integrated circuit being fabricated.

Figure 19A:
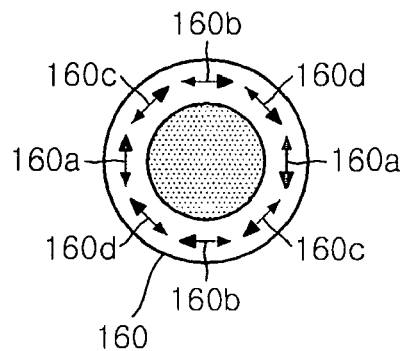
FIGS. 19A through 19C schematically illustrate the function of the photomask of FIG. 18 according to the invention when the polarizing structure of the photomask is illuminated with azimuthal annular illumination.
Figure 19B:
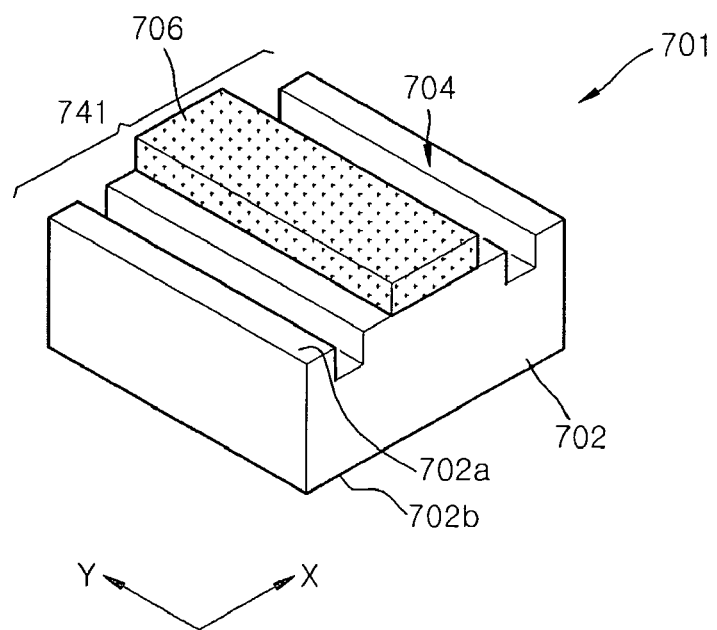
Figure 19C:
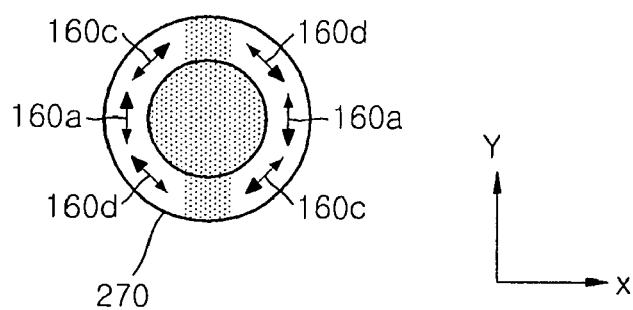

FIGS. 19A through 19C schematically illustrate the function of the photomask 701 of FIG. 18 according to the invention when the polarizing structure 704 of the photomask 701 is illuminated with azimuthal annular illumination 160. Specifically, FIG. 19B contains a schematic perspective view of a portion of the photomask 701 containing the polarization structure 704. FIG. 19A schematically illustrates azimuthal annular illumination 160 used to illuminate the photomask 701 during a photolithographic exposure. FIG. 19C schematically illustrates selective x-dipole illumination 270 created by the polarizing structure 704 from the azimuthal annular illumination 160 incident on the front surface 702b of the photomask 701. The selective x-dipole illumination 270 of FIG. 19C is emitted by the photomask 701 at its back side 702a and is used, in one embodiment, to illuminate the memory cell region of an integrated circuit during a photolithographic exposure.

The photomask 701 is a selective y-polarizer. Referring to FIG. 19A, the azimuthal annular illumination 160 from the light source of the exposure system includes a plurality of paired poles on opposite sides of an annular ring of illumination 160. Specifically, FIG. 19A illustrates four pairs of poles 160a, 160b, 160c and 160d located opposite each other on the annular ring 160.

When the azimuthal annular illumination 160 of FIG. 19A is incident on and passes through the selective y-polarizer photomask 701 of FIG. 19B, the selective x-dipole illumination 270 of FIG. 19C is generated. In one embodiment, the selective x-dipole illumination 270 of FIG. 19C is used to illuminate the memory cell region of an integrated circuit during an exposure step of a photolithographic process. Referring to FIG. 19C, the selective x-dipole illumination 270 includes only three pairs of poles 160a, 160c and 160d. The pair of poles 160b has been removed by the polarizing structure 704 of the photomask 701.

Figure 20A:
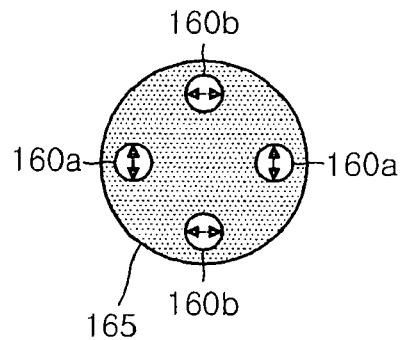
FIGS. 20A through 20C schematically illustrate the function of the photomask of FIG. 18 according to the invention when the polarizing structure of the photomask is illuminated with azimuthal annular illumination.
Figure 20B:
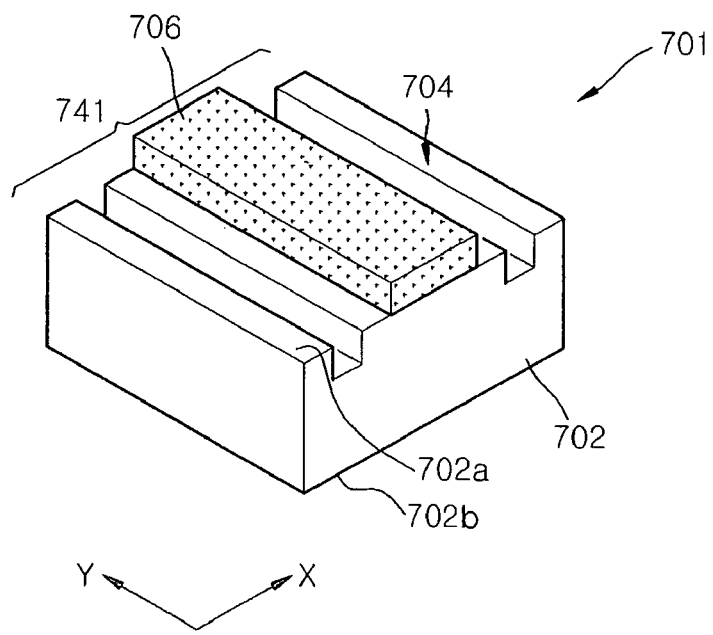
Figure 20C:
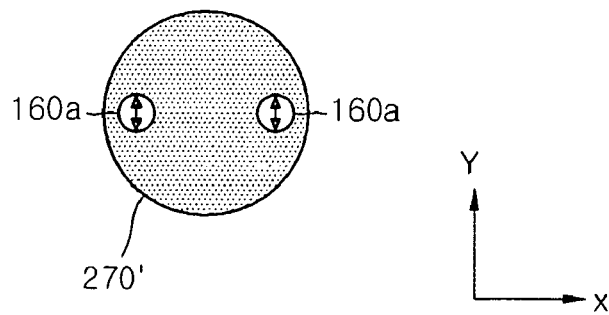

FIGS. 20A through 20C schematically illustrate the function of the photomask 701 of FIG. 18 according to the invention when the polarizing structure 704 of the photomask 701 is illuminated with azimuthal annular illumination 165. Specifically, FIG. 20B contains a schematic perspective view of the portion of the photomask 701 containing the polarization structure 704. FIG. 20A schematically illustrates azimuthal annular illumination 165 used to illuminate the photomask 701 during a photolithographic exposure. FIG. 20C schematically illustrates selective x-dipole illumination 270' created by the polarizing structure 704 from the azimuthal annular illumination 165 incident on the front surface 702b of the photomask 701. The selective x-dipole illumination 270' of FIG. 20C is emitted by the photomask 701 at its back side 702a and is used, in one embodiment, to illuminate the memory cell region of an integrated circuit during a photolithographic exposure.

The photomask 701 is a selective y-polarizer. Referring to FIG. 20A, the azimuthal annular illumination 165 from the light source of the exposure system includes a plurality of paired poles on opposite sides of an annular ring of illumination 165. Specifically, FIG. 20A illustrates two pairs of poles 160a and 160b located opposite each other on the annular ring 165.

When the azimuthal annular illumination 165 of FIG. 20A is incident on and passes through the selective y-polarizer photomask 701 of FIG. 20B, the selective x-dipole illumination 270' of FIG. 20C is generated. In one embodiment, the selective x-dipole illumination 270' of FIG. 20C is used to illuminate the memory cell region of an integrated circuit during an exposure step of a photolithographic process. Referring to FIG. 20C, the selective x-dipole illumination 270' includes only one pair of poles 160a. The pair of poles 160b has been removed by the polarizing structure 704 of the photomask 701.

Figure 21:
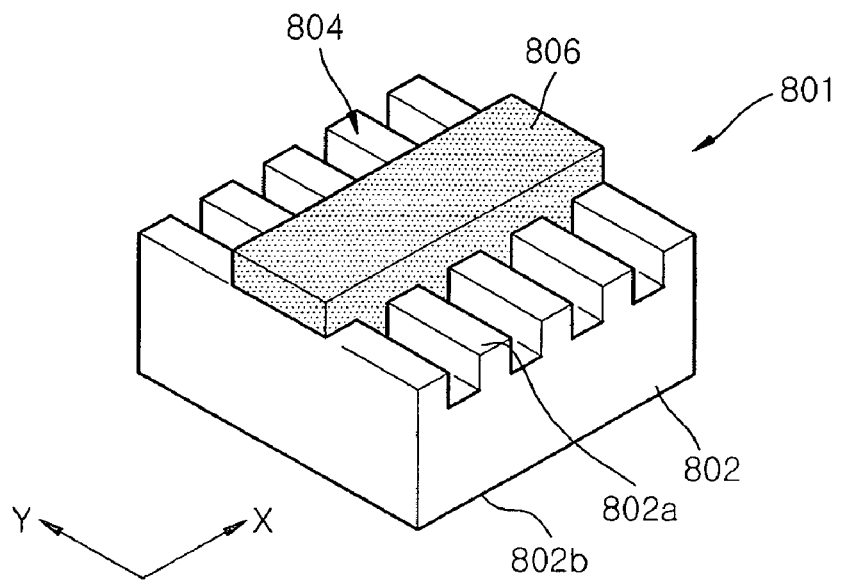
FIGS. 21 and 22 contain schematic perspective views of three types of photomask according to embodiments of the invention.
Figure 22:
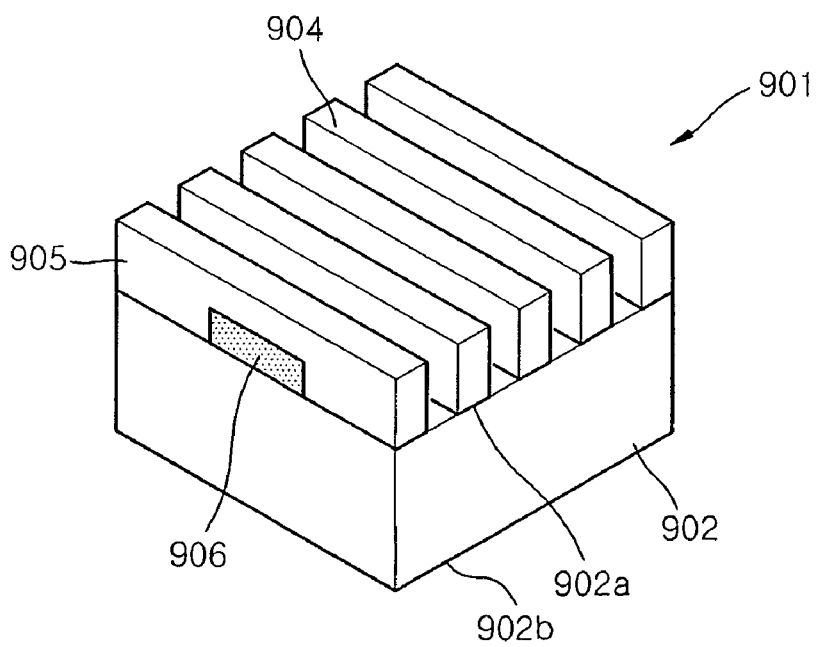

FIGS. 21 and 22 contain schematic perspective views of three types of photomask according to embodiments of the invention. The embodiments of FIGS. 21 and 22 are applicable to the embodiments of the invention described hereinabove.

FIG. 21 contains a schematic perspective view of a first type and a second type of photomask 801 in accordance with the invention. The photomask 801 of FIG. 21 is referred to herein as a "Type 1" or "Type 2" photomask. That is, Type 1 and Type 2 photomasks referred to herein have the same or similar structures. However, the process by which they are fabricated is different. Referring to FIG. 21, the photomask 801 includes a transparent substrate 802 made of a material such as quartz. The substrate 802 includes a front surface 802b and a back surface 802a on which the polarizing structure 804 of the invention is formed. The photomask 801 also includes a pattern of opaque lines 806 made of a material such as chrome. The polarizing structure 804 is formed adjacent to and on opposite sides of the opaque line 806. According to the invention, light from a source in a photolithographic exposure system is incident on the front surface 802b of the photomask 801. The polarizing structure 804 on the back side 802a of the substrate 802 alters the illumination type of the illumination exiting the back side 802a of the photomask such that it is different from the illumination type of the illumination incident on the front surface 802b of the photomask 801, in accordance with the foregoing detailed description of the invention.

FIG. 22 contains a schematic perspective view of a third type of photomask 901 in accordance with the invention. The photomask 901 of FIG. 22 is referred to herein as a "Type 2" and a "Type 3" photomask. Referring to FIG. 22, the photomask 901 includes a transparent substrate 902 made of a material such as quartz. The substrate 902 includes a front surface 902b and a back surface 902a on which the polarizing structure 904 of the invention is formed. The photomask 901 also includes a pattern of opaque lines 906 made of a material such as chrome. The polarizing structure 904 is formed adjacent to and on opposite sides of the opaque line 906. According to the invention, light from a source in a photolithographic exposure system is incident on the front surface 902b of the photomask 901. The polarizing structure 904 on the back side 902a of the substrate 902 alters the illumination type of the illumination exiting the back side 902a of the photomask such that it is different from the illumination type of the illumination incident on the front surface 902b of the photomask 901, in accordance with the foregoing detailed description of the invention.

Figure 23A:
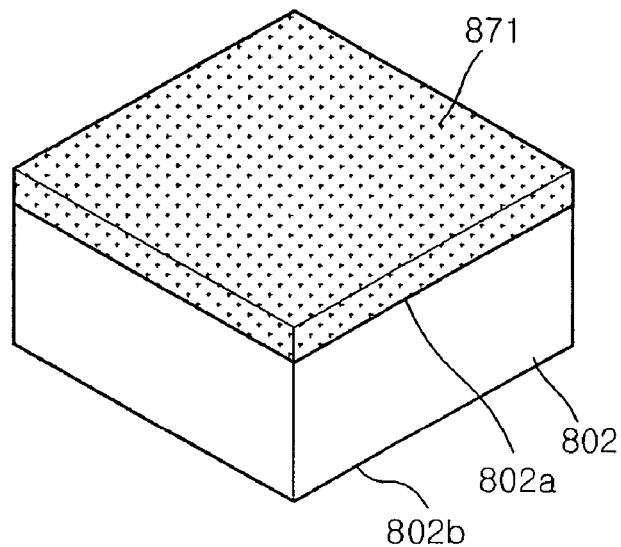
FIGS. 23A through 23E contain schematic perspective views of an embodiment of a process for fabricating the Type 1 photomask of FIG. 21.

FIGS. 23A through 23E contain schematic perspective views of an embodiment of a process for fabricating the Type 1 photomask 801 of FIG. 21. Referring to FIG. 23A, a structure having a transparent substrate 802 made of a material such as quartz is provided. The substrate 802 has a front surface 802b and a back surface 802a. A film of opaque material such as chrome 871 is formed on the back surface 802a of the substrate 802.

Figure 23B:
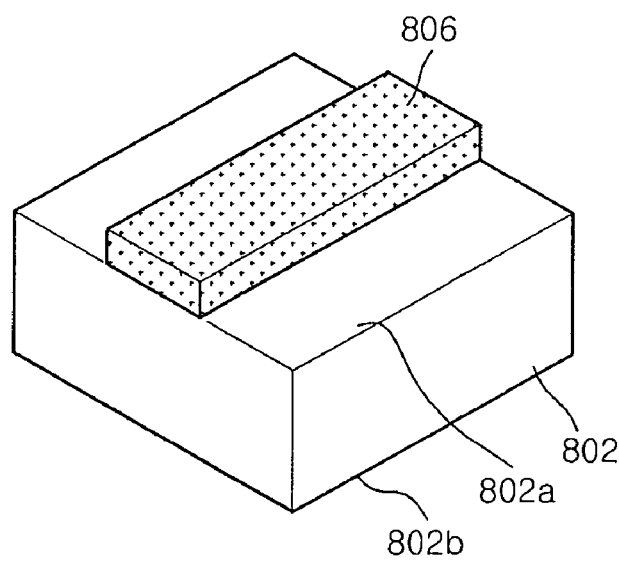
Figure 23C:
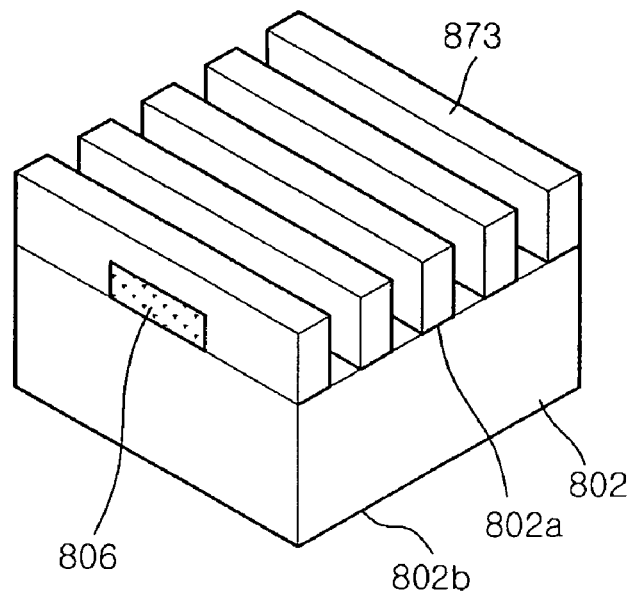
Figure 23D:
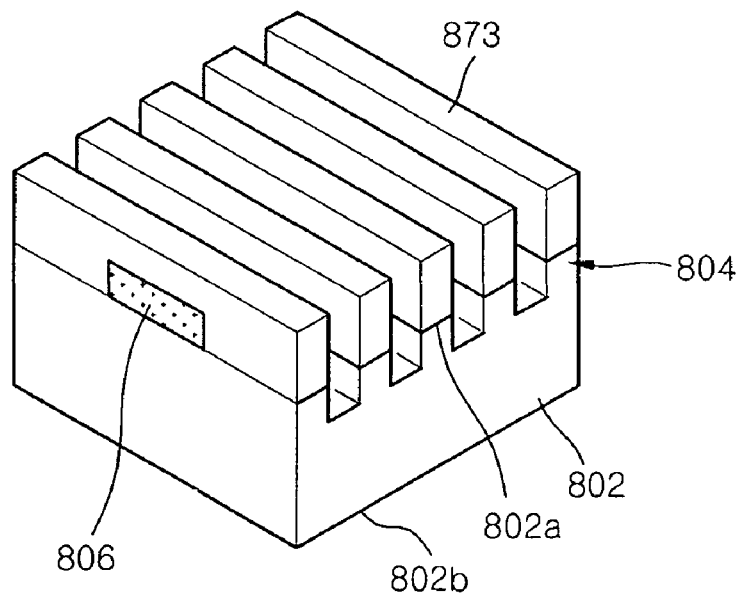
Figure 23E:
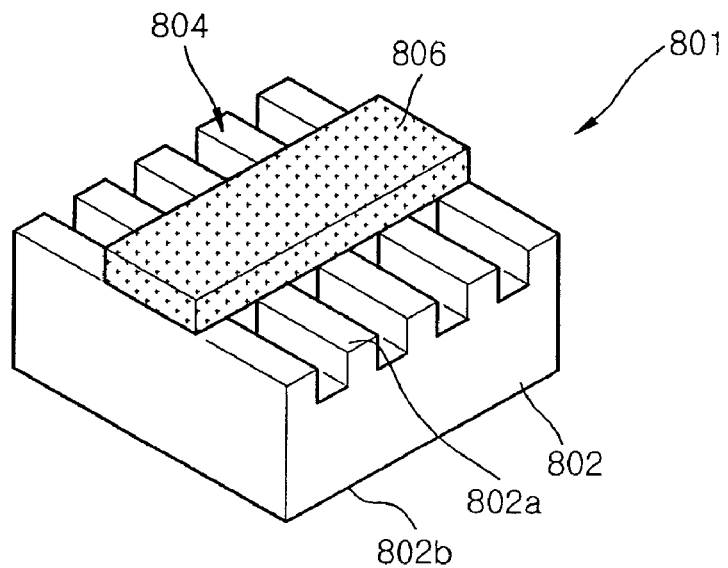

Referring to FIG. 23B, the chrome film 806 is patterned such as by etching to form the pattern of lines 806 on the back surface 802a of the substrate 802. Referring to FIG. 23C, an etching mask 873 is formed on the back surface 802a of the substrate 802 and the opaque line 806, and the etching mask 873 is patterned. Referring to FIG. 23D, the substrate 802 is etched to form the polarizing structure 804 on the back surface 802a using the etching mask 873. Referring to FIG. 23E, the etching mask 873 is removed.

Figure 24A:
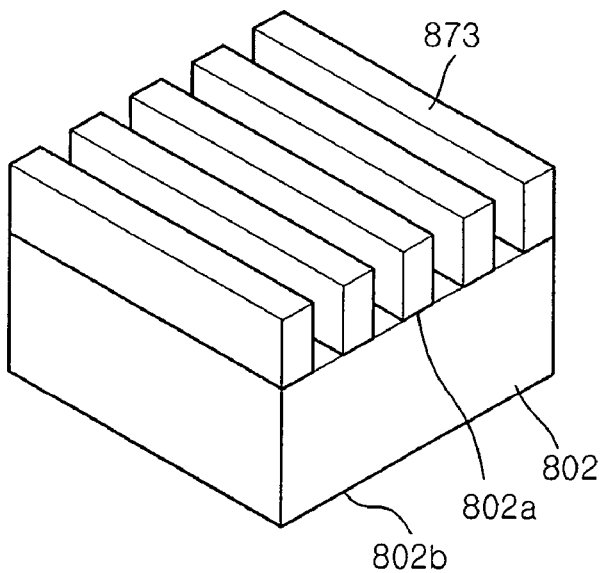
FIGS. 24A through 24D contain schematic perspective views of an embodiment of a process for fabricating the Type 2 photomask of FIG. 21.
Figure 24B:
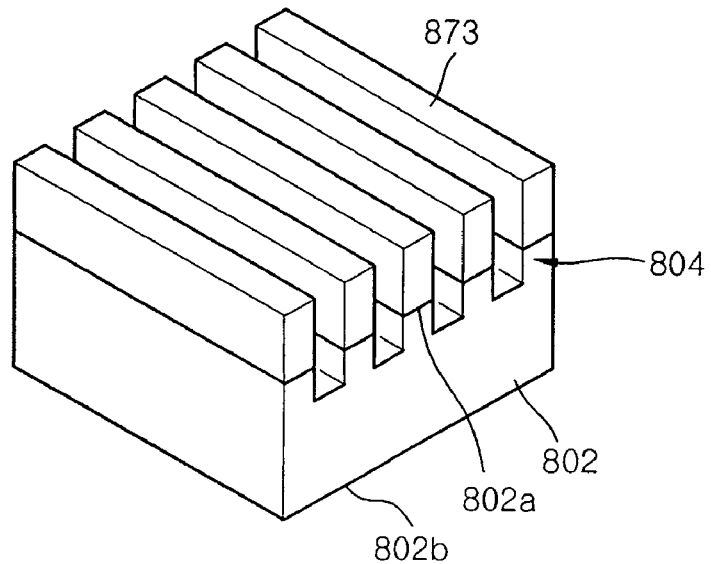
Figure 24C:
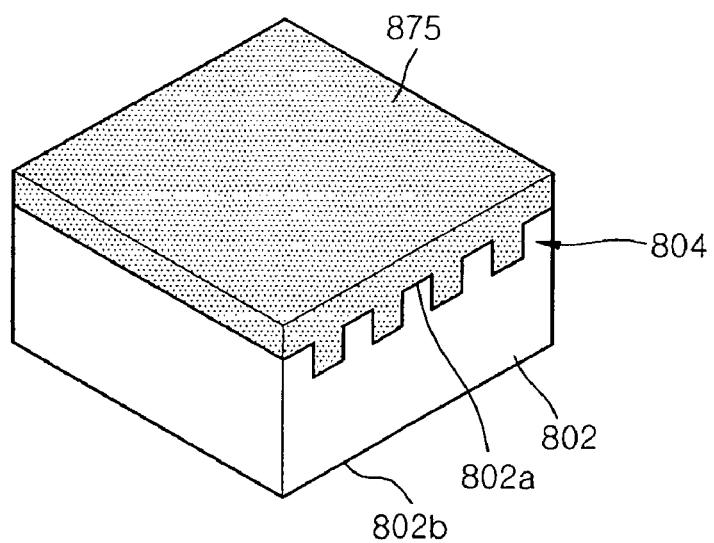
Figure 24D:
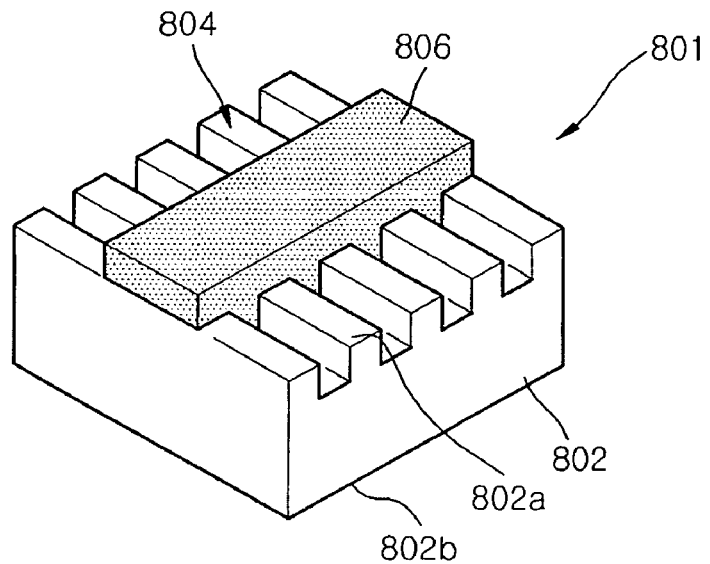

FIGS. 24A through 24D contain schematic perspective views of an embodiment of a process for fabricating the Type 2 photomask 801 of FIG. 21. Referring to FIG. 24A, a transparent substrate 802 made of a material such as quartz is provided. The substrate 802 has a front surface 802b and a back surface 802a. An etching mask 873 is formed on the back surface 802a of the substrate 802. Referring to FIG. 24B, the substrate 802 is etched to form the polarizing structure 804 on the back surface 802a using the etching mask 873. Referring to FIG. 24C, the etching mask 873 is removed, and a film of opaque material such as chrome 875 is formed on the back surface 802a of the substrate 802 having the polarizing structure 804. Referring to FIG. 24D, the chrome film 806 is patterned such as by etching to form the pattern of lines 806 on the back surface 802a of the substrate 802.

It should be noted that the structure of the photomask 801 formed by the process described in connection with FIGS. 23A through 23E is different than the structure of the photomask 801 formed by the process described in connection with FIGS. 24A through 24D. Specifically, in the photomask 801 formed by the process of FIGS. 23A through 23E (Type 1), the polarizing structure 804 is formed after the opaque line 806 is formed. As a result, in the Type 1 photomask 801, the polarizing structure is present on the substrate 802 only adjacent to and not under the line 806. In contrast, in the photomask 801 formed by the process of FIGS. 24A through 24D (Type 2), the polarizing structure 804 is formed before the opaque line 806. As a result, in the Type 2 photomask 801, the polarizing structure 804 is formed adjacent to and also under the opaque line 806.

Figure 25A:
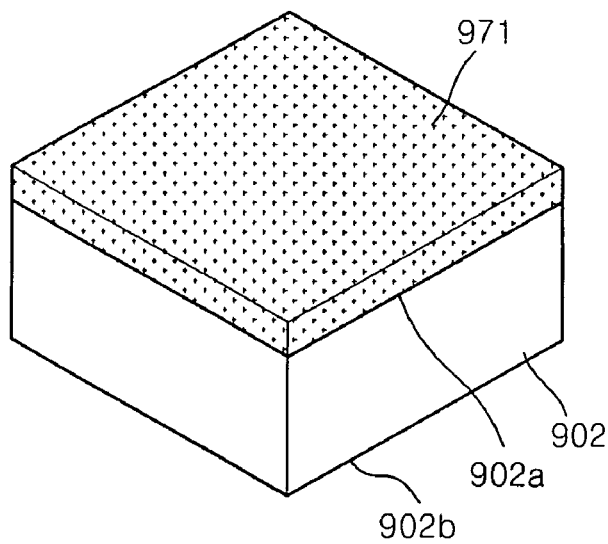
FIGS. 25A through 25D contain schematic perspective views of an embodiment of a process for fabricating the Type 3 photomask 901 of FIG. 22.

FIGS. 25A through 25D contain schematic perspective views of an embodiment of a process for fabricating the Type 3 photomask 901 of FIG. 22. Referring to FIG. 25A, a structure having a transparent substrate 902 made of a material such as quartz is provided. The substrate 902 has a front surface 902b and a back surface 902a. A film of opaque material such as chrome 971 is formed on the back surface 902a of the substrate 902.

Figure 25B:
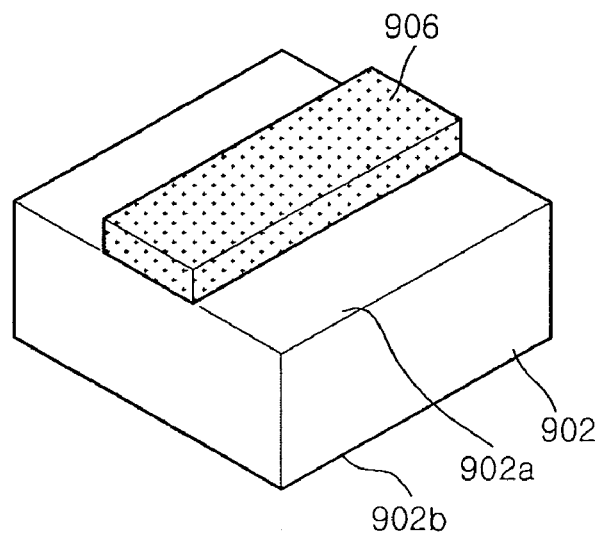
Figure 25C:
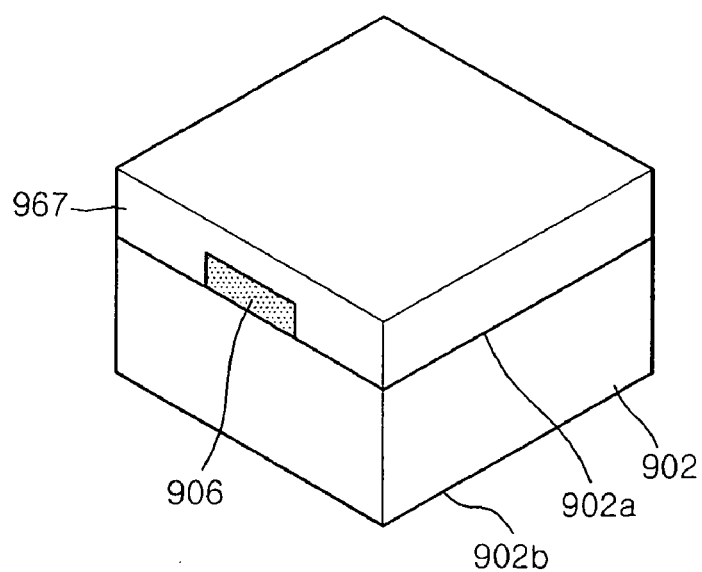
Figure 25D:
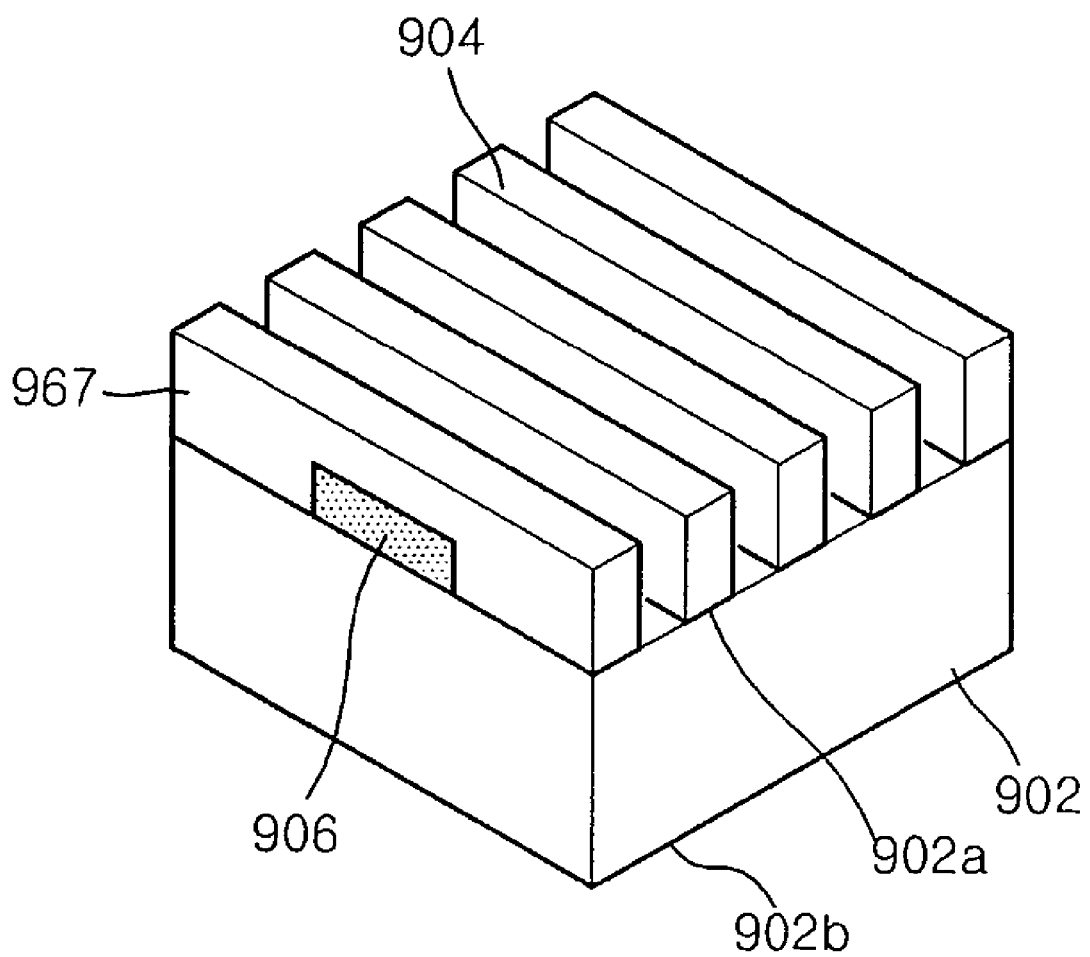

Referring to FIG. 25B, the chrome film 906 is patterned such as by etching to form the pattern of lines 906 on the back surface 902a of the substrate 902. Referring to FIG. 25C, a layer 967 of transparent material such as quartz is deposited on the back surface 902a and the line 906. The thickness of the layer 967 is comparable to the wavelength $\lambda$ of the illuminating light of the exposure system. Referring to FIG. 25D, an etching mask (not shown) is formed on the layer 967, and the layer 967 is etched using the etching mask to form the polarizing structure 904 on the back surface 902a of the substrate 902, and the etching mask is removed.

Figure 26:
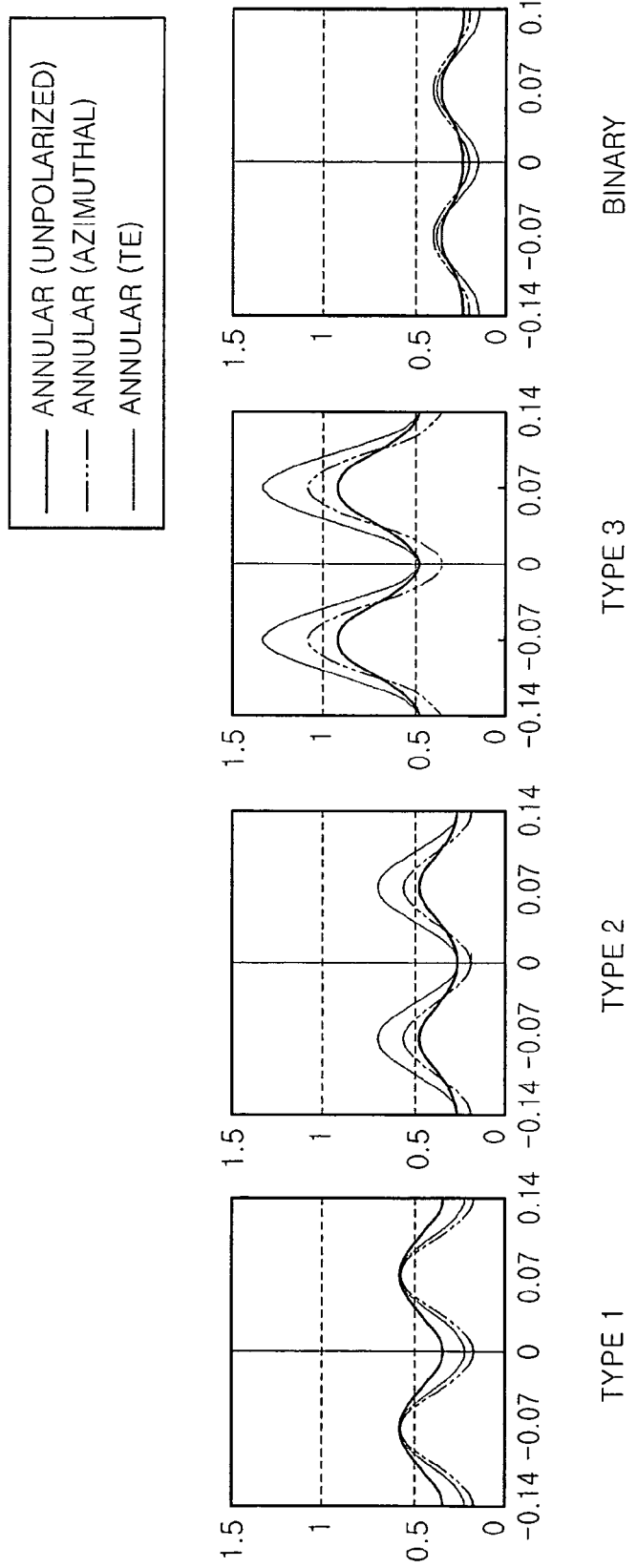
FIG. 26 contains curves of feature contrast for the Type 1, Type 2 and Type 3 photomasks of the invention and a standard binary mask without the polarizing structure of the invention.

FIG. 26 contains curves of feature contrast for the Type 1, Type 2 and Type 3 photomasks of the invention and a standard binary mask without the polarizing structure of the invention. The curves of FIG. 26 illustrate that all of the photomasks of the invention have improved feature contrast, and, therefore, improved resolution, over the conventional binary mask. The horizontal axis is the position of the Cr pattern on the photomask, and the vertical axis is the intensity of light. Specifically, position 0 is the position of the center of one Cr pattern and 0.14 or −0.14 is that of another Cr pattern. the curve represents the aerial image of the light intensity transmitted by the photomask. the three curves in each graph are distinguished by the illumination condition, i.e., unpolarized annular illumination, azimuthal annular illumination, TE polarized annular illumination and non-polarized annular illumination, of incident light. The wider the amplitude of the wave in the graph, the greater the resolution of the photomask is. Therefore, the graphs illustrate that all of the photomasks of the invention have improved feature contrast, and, therefore, improved resolution, over the conventional binary mask.

Figure 27:
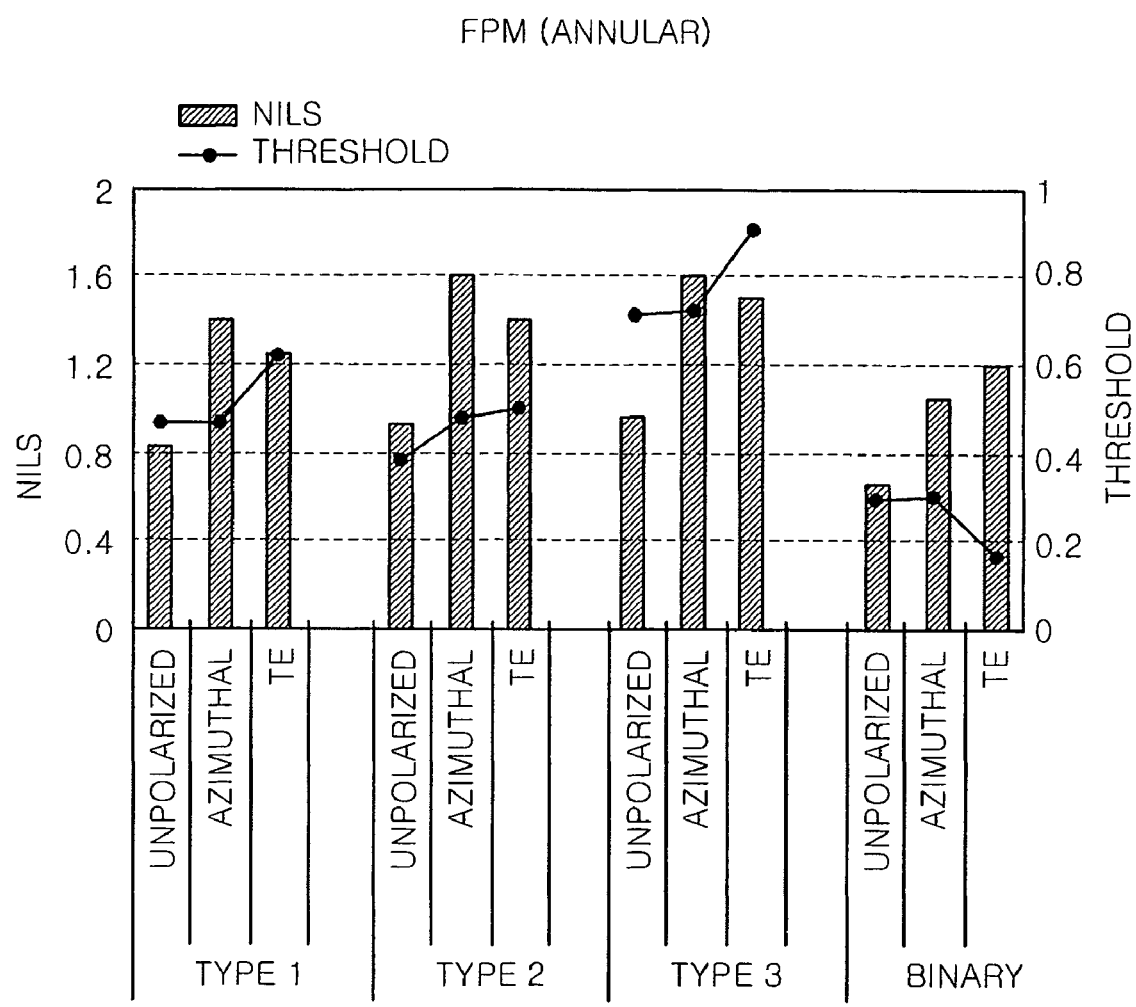
FIG. 27 contains a graph of performance of the three photomask types of the invention and the conventional binary mask.

FIG. 27 contains a graph of performance of the three photomask types of the invention and the conventional binary mask. In the graph of FIG. 27, the threshold is the light intensity at which the target CD in the aerial image is achieved. NILS is normalized image log slope. A higher NILS means more powerful lithographic performance. FPM means frontside polarized mask.

The present invention provides a photomask and a method of making a photomask which provide selective, regional optimization of illumination during a photolithographic exposure operation. The various photomasks and methods of fabricating photomasks described herein can be applied selectively to multiple regions of a single photomask to generate optimized illumination conditions. That is, one of the types of photomask described herein can be applied to multiple regions of the same photomask and/or different types of the photomasks described herein can be applied to multiple regions of a single photomask. In this way, a single photomask in accordance with the invention can be used to produce multiple regions of optimized illumination conditions for use by the single photomask during an exposure operation. The multiple regions can have the same and/or different optimized illumination conditions.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A photomask, comprising:
   a substrate having a first surface, a second surface, a first region between the first surface and second surface and a second region between the first surface and second surface;
   a polarizing structure formed in the first surface of the substrate in one of the first and second regions, such that when radiation of a first illumination type impinges on the substrate and the polarizing structure, radiation of a second illumination type, which is polarized, is formed in the one of the first and second regions and radiation of a third illumination type is formed in the other of the first and second regions; and
   a pattern formed on the substrate;
   wherein the polarizing structure is formed on a chrome side of the substrate.

2. The photomask of claim 1, wherein the first and third illumination types are the same.

3. The photomask of claim 1, wherein the first illumination type is azimuthal polarized illumination.

4. The photomask of claim 3, wherein the azimuthal polarized illumination is azimuthal cross-pole illumination.

5. The photomask of claim 1, wherein the first illumination type is annular type illumination.

6. The photomask of claim 1, wherein the first illumination type is quadrupole type illumination.

7. The photomask of claim 1, wherein the second illumination type is formed by the radiation passing through the first region.

8. The photomask of claim 7, wherein the first region is a polarized region.

9. The photomask of claim 8, wherein the third illumination type is the same as the first illumination type.

10. The photomask of claim 7, wherein the second illumination type is dipole.

11. The photomask of claim 1, wherein the pattern comprises chrome.

12. The photomask of claim 1, wherein the polarizing structure is formed in proximity to the pattern.

13. The photomask of claim 1, wherein the polarizing structure comprises a pattern of grooves formed in the substrate.

14. The photomask of claim 1, wherein the substrate comprises quartz.

15. A method of making a photomask, comprising:
    providing a substrate having a first surface, a second surface, a first region between the first surface and the second surface and a second region between the first surface and the second surface;
    forming a polarizing structure in the first surface of the substrate in one of the first and second regions, such that when radiation of a first illumination type impinges on the substrate and the polarizing structure, radiation of a second illumination type, which is polarized, is formed in the one of the first and second regions and radiation of a third illumination type is formed in the other of the first and second regions; and
    forming a pattern on the substrate,
    wherein the polarizing structure is formed on a chrome side of the substrate.

16. The method of claim 15, wherein the first and third illumination types are the same.

17. The method of claim 15, wherein the first illumination type is azimuthal polarized illumination.

18. The method of claim 17, wherein the azimuthal polarized illumination is azimuthal cross-pole illumination.

19. The method of claim 15, wherein the first illumination type is annular type illumination.

20. The method of claim 15, wherein the first illumination type is quadrupole type illumination.

21. The method of claim 15, wherein the second illumination type is formed by the radiation passing through the first region.

22. The method of claim 21, wherein the first region is a polarized region.

23. The method of claim 22, wherein the third illumination type is the same as the first illumination type.

24. The method of claim 21, wherein the second illumination type is dipole.

25. The method of claim 15, wherein the pattern comprises chrome.

26. The method of claim 15, wherein the polarizing structure is formed in proximity to the pattern.

27. The method of claim 15, wherein the polarizing structure comprises a pattern of grooves formed in the substrate.

28. The method of claim 15, wherein the substrate comprises quartz.

29. The method of claim 15, further comprising:
    forming a layer of opaque material over the substrate;
    patterning the layer of opaque material to form a pattern on the substrate;
    forming a layer of transparent material over the pattern; and
    patterning the transparent material to form the polarizing structure in proximity to the pattern.

30. The method of claim 29, wherein the substrate is made of the transparent material.

31. The method of claim 29, wherein the transparent material comprises quartz.

32. The method of claim 29, wherein the opaque material comprises chrome.

33. The method of claim 15, further comprising:
    patterning the substrate to form the polarizing structure;
    forming a layer of opaque material over the substrate with the polarizing structure; and
    patterning the opaque material to form a pattern in proximity to the polarizing structure.

34. The method of claim 33, wherein the opaque material comprises chrome.

35. The method of claim 15, further comprising:
    forming a layer of opaque material over the substrate;
    patterning the layer of opaque material to form a pattern on the substrate, such that a portion of the substrate is exposed; and patterning the exposed portion of the substrate to form the polarizing structure in proximity to the pattern.

36. The method of claim 35, wherein the opaque material comprises chrome.

37. A photolithography method used in fabricating a circuit, comprising:
positioning a photomask over a semiconductor substrate on which the circuit is to be formed, the circuit having first and second regions corresponding to first and second regions of the photomask, the photomask having a first surface, a second surface, the first region between the first surface and the second surface, the second region between the first surface and the second surface, and a polarizing structure formed on the first surface in one of the first and second regions of the photomask; and
illuminating the photomask with radiation of a first illumination type, such that radiation of a second illumination type, which is polarized, impinges on the one of the first and second regions of the substrate corresponding to the one of the first and second regions of the photomask, and radiation of a third illumination type impinges on the other of the first and second regions of the substrate.

38. The method of claim 37, wherein the circuit is a memory circuit.

39. The method of claim 38, wherein the circuit is a DRAM circuit.

40. The method of claim 38, wherein the first region of the circuit comprises memory cells, and the second region of the circuit comprises peripheral circuitry.

41. The method of claim 37, wherein the first and third illumination types are the same.

42. The method of claim 37, wherein the first illumination type is azimuthal polarized illumination.

43. The method of claim 42, wherein the azimuthal polarized illumination is azimuthal cross-pole illumination.

44. The method of claim 37, wherein the first illumination type is annular type illumination.

45. The method of claim 37, wherein the first illumination type is quadrupole type illumination.

46. The method of claim 37, wherein the second illumination type is formed by the radiation passing through the first region.

47. The method of claim 46, wherein the first region is a polarized region.

48. The method of claim 47, wherein the third illumination type is the same as the first illumination type.

49. The method of claim 46, wherein the second illumination type is dipole.

50. A photomask, comprising:
a substrate having a first surface, a second surface, a first region between the first surface and the second surface and a second region between the first surface and the second surface; and
a polarizing structure formed in the substrate in one of the first and second regions; wherein
the polarizing structure is formed on the first surface which is a surface of a chrome side of the substrate.

51. A method of making a photomask, comprising:
providing a substrate having a first surface, a second surface, a first region between the first surface and the second surface and a second region between the first surface and the second surface; and
forming a polarizing structure in the substrate in one of the first and second regions; wherein
the polarizing structure is formed on the first surface which is a surface of a chrome side of the substrate.

52. A method of making a photomask, comprising:
providing a substrate having a first region and a second region;
forming a layer of opaque material over the substrate;
patterning the layer of opaque material to form a pattern on the substrate;
forming a layer of transparent material over the pattern; and
forming a polarizing structure in the substrate in one of the first and second regions by patterning the transparent material to form the polarizing structure in proximity to the pattern, such that when radiation of a first illumination type impinges on the substrate and the polarizing structure, radiation of a second illumination type, which is polarized, is formed in the one of the first and second regions and radiation of a third illumination type is formed in the other of the first and second regions.

53. The method of claim 52, wherein the substrate is made of the transparent material.

54. The method of claim 52, wherein the transparent material comprises quartz.

55. The method of claim 52, wherein the opaque material comprises chrome.

56. A method of making a photomask, comprising:
providing a substrate having a first region and a second region;
forming a polarizing structure in the substrate in one of the first and second regions by patterning the substrate to form the polarizing structure, such that when radiation of a first illumination type impinges on the substrate and the polarizing structure, radiation of a second illumination type, which is polarized, is formed in the one of the first and second regions and radiation of a third illumination type is formed in the other of the first and second regions;
forming a layer of opaque material over the substrate with the polarizing structure; and
patterning the opaque material to form a pattern in proximity to the polarizing structure.

57. The method of claim 56, wherein the opaque material comprises chrome.

58. A method of making a photomask, comprising:
providing a substrate having a first region and a second region;
forming a layer of opaque material over the substrate;
patterning the layer of opaque material to form a pattern on the substrate, such that a portion of the substrate is exposed; and
forming a polarizing structure in the substrate in one of the first and second regions by patterning the exposed portion of the substrate to form the polarizing structure in proximity to the pattern, such that when radiation of a first illumination type impinges on the substrate and the polarizing structure, radiation of a second illumination type, which is polarized, is formed in the one of the first and second regions and radiation of a third illumination type is formed in the other of the first and second regions.

59. The method of claim 58, wherein the opaque material comprises chrome.

* * * * *

UNITED STATES PATENT AND TRADEMARK OFFICE
CERTIFICATE OF CORRECTION

| | |
|---|---|
| PATENT NO. | : 7,629,087 B2 |
| APPLICATION NO. | : 11/438965 |
| DATED | : December 8, 2009 |
| INVENTOR(S) | : Sungmin Huh et al. |

It is certified that error appears in the above-identified patent and that said Letters Patent is hereby corrected as shown below:

Column 18, line 12, insert --the surface of-- after "on"

Column 20, line 7, delete "pattering" and insert --patterning--

Signed and Sealed this

Fourth Day of May, 2010

David J. Kappos
*Director of the United States Patent and Trademark Office*

UNITED STATES PATENT AND TRADEMARK OFFICE
CERTIFICATE OF CORRECTION

PATENT NO.         : 7,629,087 B2                                              Page 1 of 1
APPLICATION NO.    : 11/438965
DATED              : December 8, 2009
INVENTOR(S)        : Sungmin Huh et al.

It is certified that error appears in the above-identified patent and that said Letters Patent is hereby corrected as shown below:

Title page (*) Notice

Delete "by 360 days" – and insert --by 559 days--

Signed and Sealed this

Twenty-fourth Day of August, 2010

David J. Kappos
*Director of the United States Patent and Trademark Office*